US009818470B2

(12) United States Patent
Best et al.

(10) Patent No.: US 9,818,470 B2
(45) Date of Patent: *Nov. 14, 2017

(54) MULTI-DIE MEMORY DEVICE

(71) Applicant: Rambus Inc., Sunnyvale, CA (US)

(72) Inventors: Scott C. Best, Palo Alto, CA (US); Ming Li, Fremont, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/098,269

(22) Filed: Apr. 13, 2016

(65) Prior Publication Data
US 2016/0225431 A1    Aug. 4, 2016

Related U.S. Application Data

(63) Continuation of application No. 14/797,057, filed on Jul. 10, 2015, now Pat. No. 9,324,411, which is a
(Continued)

(51) Int. Cl.
*G11C 5/02* (2006.01)
*G11C 11/4093* (2006.01)
(Continued)

(52) U.S. Cl.
CPC ............ *G11C 11/4093* (2013.01); *G11C 5/02* (2013.01); *G11C 5/025* (2013.01); *G11C 5/04* (2013.01);
(Continued)

(58) Field of Classification Search
USPC ........... 365/51, 63, 230.03, 233.11; 257/690, 257/678
See application file for complete search history.

(56) References Cited

U.S. PATENT DOCUMENTS 5,838,603 A    11/1998 Mori et al.
6,236,602 B1    5/2001 Patti
(Continued)

FOREIGN PATENT DOCUMENTS

JP    02-134797    5/1990
JP    09-185427 A    7/1997
(Continued)

OTHER PUBLICATIONS

EP Communication dated Jun. 1, 2011 re EP Application No. 07865620.4, 3 pages.
(Continued)

*Primary Examiner* — Vu Le
(74) *Attorney, Agent, or Firm* — Lance Kreisman; Peninsula Patent Group

(57) ABSTRACT

A memory is disclosed that includes a logic die having first and second memory interface circuits. A first memory die is stacked with the logic die, and includes first and second memory arrays. The first memory array couples to the first memory interface circuit. The second memory array couples to the second interface circuit. A second memory die is stacked with the logic die and the first memory die. The second memory die includes third and fourth memory arrays. The third memory array couples to the first memory interface circuit. The fourth memory array couples to the second memory interface circuit. Accesses to the first and third memory arrays are carried out independently from accesses to the second and fourth memory arrays.

18 Claims, 12 Drawing Sheets

Related U.S. Application Data continuation of application No. 14/278,655, filed on May 15, 2014, now Pat. No. 9,082,463, which is a continuation of application No. 13/562,242, filed on Jul. 30, 2012, now Pat. No. 8,737,106, which is a continuation of application No. 12/519,353, filed as application No. PCT/US2007/087359 on Dec. 13, 2007, now Pat. No. 8,233,303.

(60) Provisional application No. 60/870,065, filed on Dec. 14, 2006.

(51) Int. Cl.

| | | |
|---|---|---|
| *G11C 11/4096* | (2006.01) | |
| *G11C 5/04* | (2006.01) | |
| *H01L 25/065* | (2006.01) | |
| *H01L 25/10* | (2006.01) | |
| *H01L 25/18* | (2006.01) | |
| *H01L 23/48* | (2006.01) | |
| *H01L 23/00* | (2006.01) | |

(52) U.S. Cl.
CPC ........ *G11C 11/4096* (2013.01); *H01L 23/481* (2013.01); *H01L 25/0652* (2013.01); *H01L 25/0657* (2013.01); *H01L 25/105* (2013.01); *H01L 25/18* (2013.01); *H01L 24/73* (2013.01); *H01L 2224/16225* (2013.01); *H01L 2224/32145* (2013.01); *H01L 2224/32225* (2013.01); *H01L 2224/48091* (2013.01); *H01L 2224/48225* (2013.01); *H01L 2224/48227* (2013.01); *H01L 2224/73265* (2013.01); *H01L 2225/0651* (2013.01); *H01L 2225/0652* (2013.01); *H01L 2225/06541* (2013.01); *H01L 2225/06558* (2013.01); *H01L 2225/06562* (2013.01); *H01L 2225/1023* (2013.01); *H01L 2225/1058* (2013.01); *H01L 2924/00014* (2013.01); *H01L 2924/01019* (2013.01); *H01L 2924/01055* (2013.01); *H01L 2924/14* (2013.01); *H01L 2924/15311* (2013.01); *H01L 2924/15321* (2013.01); *H01L 2924/15331* (2013.01); *H01L 2924/3011* (2013.01)

(56) References Cited

U.S. PATENT DOCUMENTS

| | | | |
|---|---|---|---|
| 6,469,945 B2 | 10/2002 | Patti et al. | |
| 6,734,693 B2 | 5/2004 | Nakayama | |
| 7,089,473 B2 | 8/2006 | Mates | |
| 7,477,535 B2 | 1/2009 | Lahtinen et al. | |
| 7,562,193 B2 | 7/2009 | Floman et al. | |
| 7,579,683 B1 | 8/2009 | Falik et al. | |
| 2002/0164838 A1* | 11/2002 | Moon | H01L 23/4985 438/107 |
| 2004/0098519 A1 | 5/2004 | Cheung et al. | |
| 2005/0082664 A1 | 4/2005 | Funaba et al. | |
| 2005/0099834 A1 | 5/2005 | Funaba et al. | |
| 2005/0139977 A1 | 6/2005 | Nishio et al. | |
| 2005/0189639 A1 | 9/2005 | Tanie et al. | |
| 2005/0285174 A1 | 12/2005 | Saito et al. | |
| 2006/0233012 A1 | 10/2006 | Sekiguchi et al. | |
| 2007/0005876 A1 | 1/2007 | Ikeda et al. | |
| 2007/0023887 A1* | 2/2007 | Matsui | H01L 24/73 257/686 |
| 2007/0070669 A1 | 3/2007 | Tsern | |
| 2007/0158825 A1 | 7/2007 | Meir | |
| 2008/0084725 A1 | 4/2008 | Lahtinen et al. | |
| 2008/0130395 A1 | 6/2008 | Silvestri | |

FOREIGN PATENT DOCUMENTS

| | | |
|---|---|---|
| JP | 2000-187612 A | 7/2000 |
| JP | 2003-122625 A | 4/2003 |
| JP | 2003-242021 A | 8/2003 |
| JP | 2006-277870 A | 10/2006 |
| JP | 2006-330974 | 12/2006 |
| WO | WO-00-36512 A1 | 6/2000 |
| WO | WO-2007-002324 | 1/2007 |
| WO | WO-2007-028109 A2 | 3/2007 |

OTHER PUBLICATIONS

EP Extended Search Report dated May 19, 2015 in EP Application No. 12171619,5, 5 pages.
EP Office Action dated Jun. 7, 2010 re EP Application No. 07865620.4. 4 pages.
EP Response dated Aug. 8, 2011 re EP Application No. 07865620.4. 19 pages.
EP Response dated Dec. 16, 2010 re EP Application No. 07865620. 4. 8 pages.
EP Response dated Jun. 25, 2015 in EP Application No, 12171619. 5, Includes New Claims and New Description Page (Highlighted and Clear copies). 15 pages.
JP Office Action dated Dec. 24, 2013 in JP Application No. 2009-541577, Included English Translation. 4 pages.
JP Voluntary Amendment and Request for Examination dated Dec. 13, 2010 re JP Application No. 2009-541577. 8 pages (no translation).
KR Office Action dated Dec. 28, 2014 in KR Application No. 10-2009-7014543, Includes English Translation. 4 pages.
KR Office Action dated Dec. 31, 2013 in KR Application No. 2009-7014543, Includes English Translation, 8 pages.
Rajan, Suresh N., re Provisional Application and Figures as Filed "Methods and Apparatus of Stacking DRAMS". 46 pages.
Rajan, Suresh N., U.S. Appl. No. 60/693,631, filed Jun. 24, 2005, re Provisional Application with Figures as Filed "Methods and Apparatus for Integrating Multi-Chip Memory Devices". 58 pages.
Rambus Confidential, "Chip-Stack DRAM Development Using Through-Silicon-Via," Elpida Memory, May 9, 2006. 21 pages.

* cited by examiner

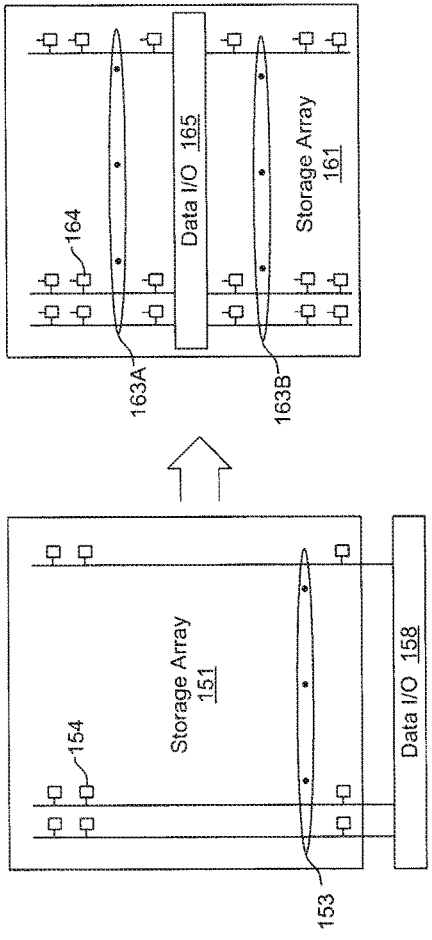
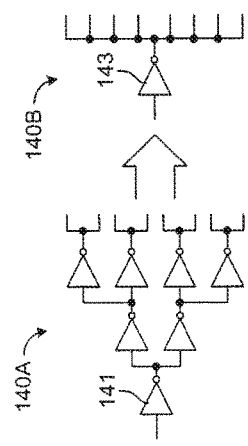
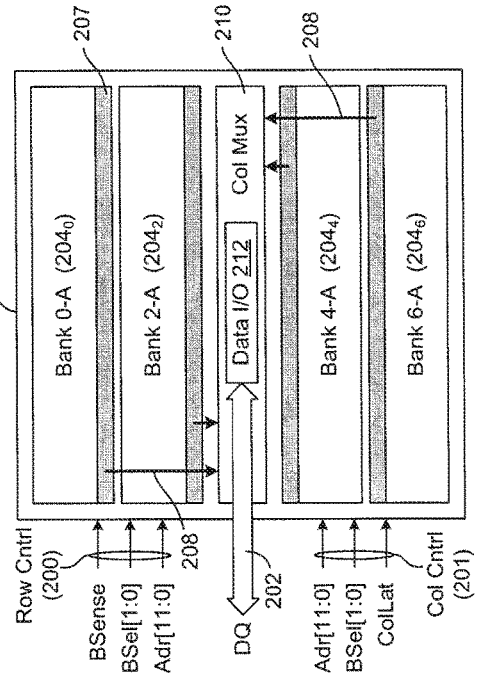
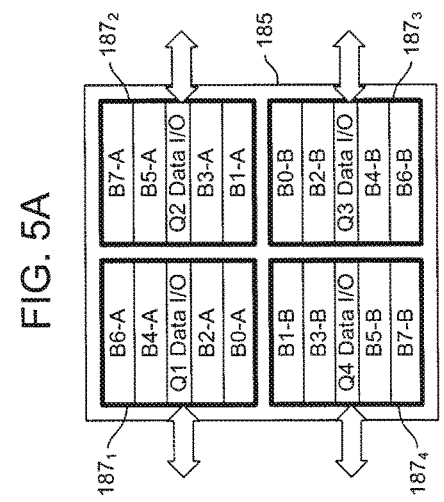
FIG. 4
FIG. 5B
FIG. 3
FIG. 5A

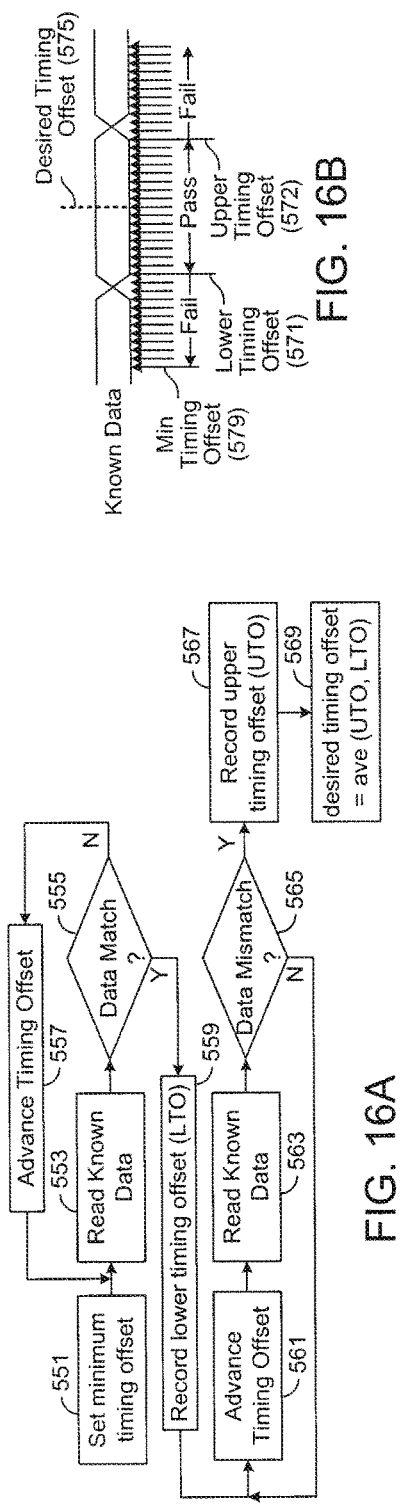
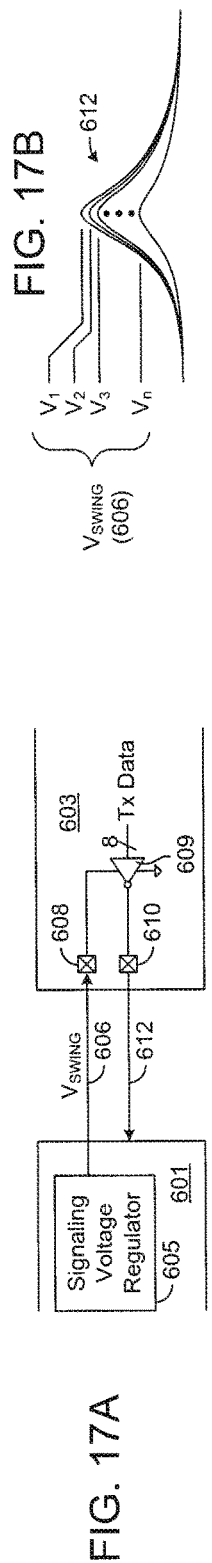
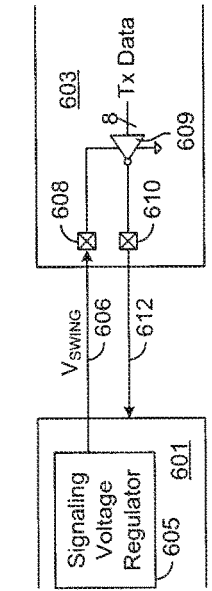
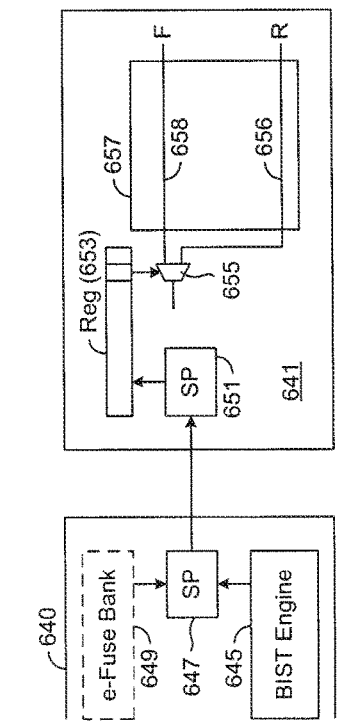
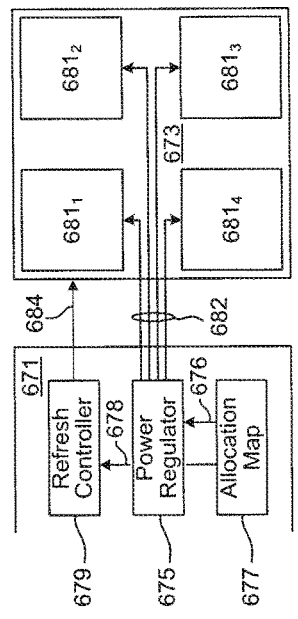

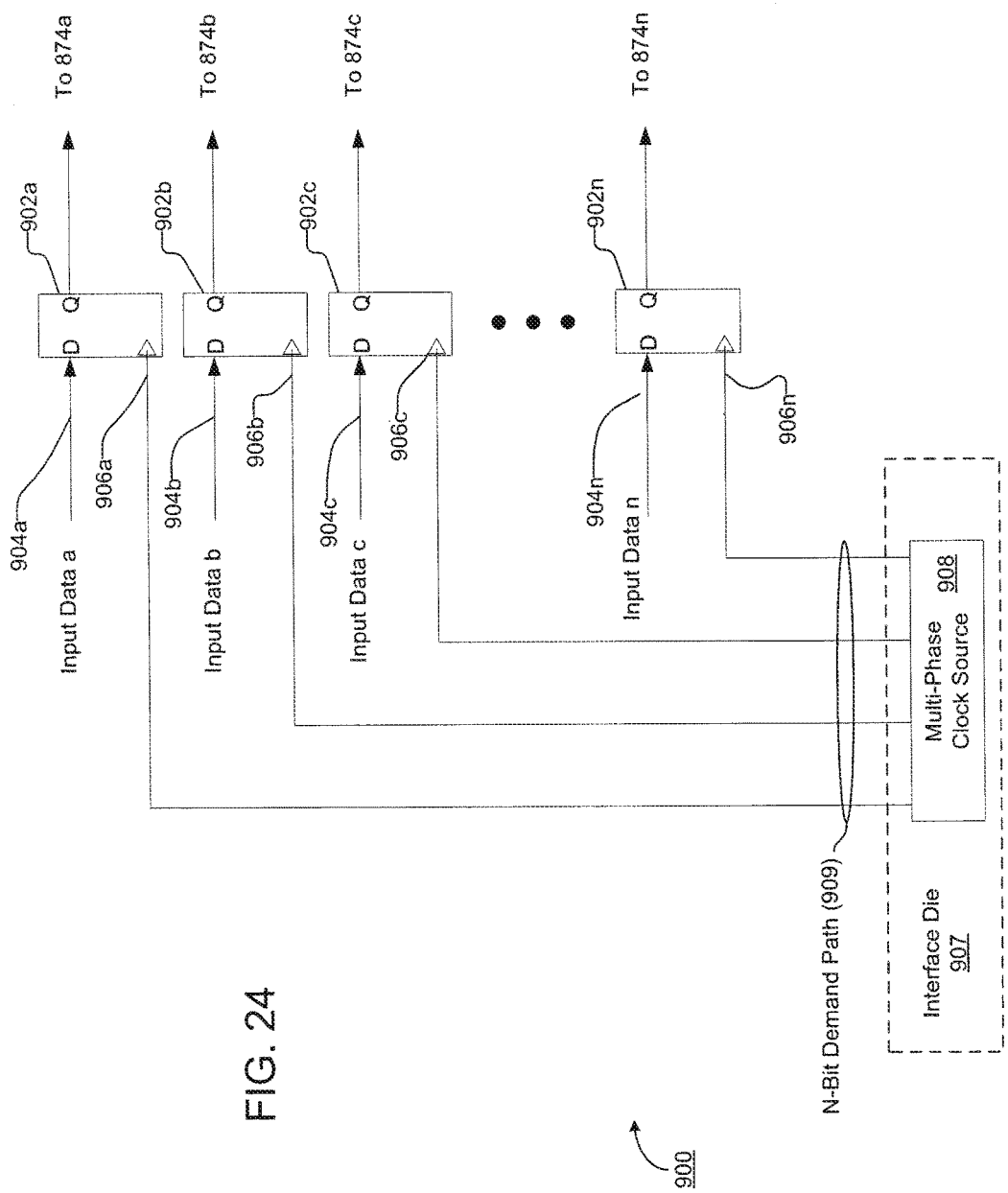

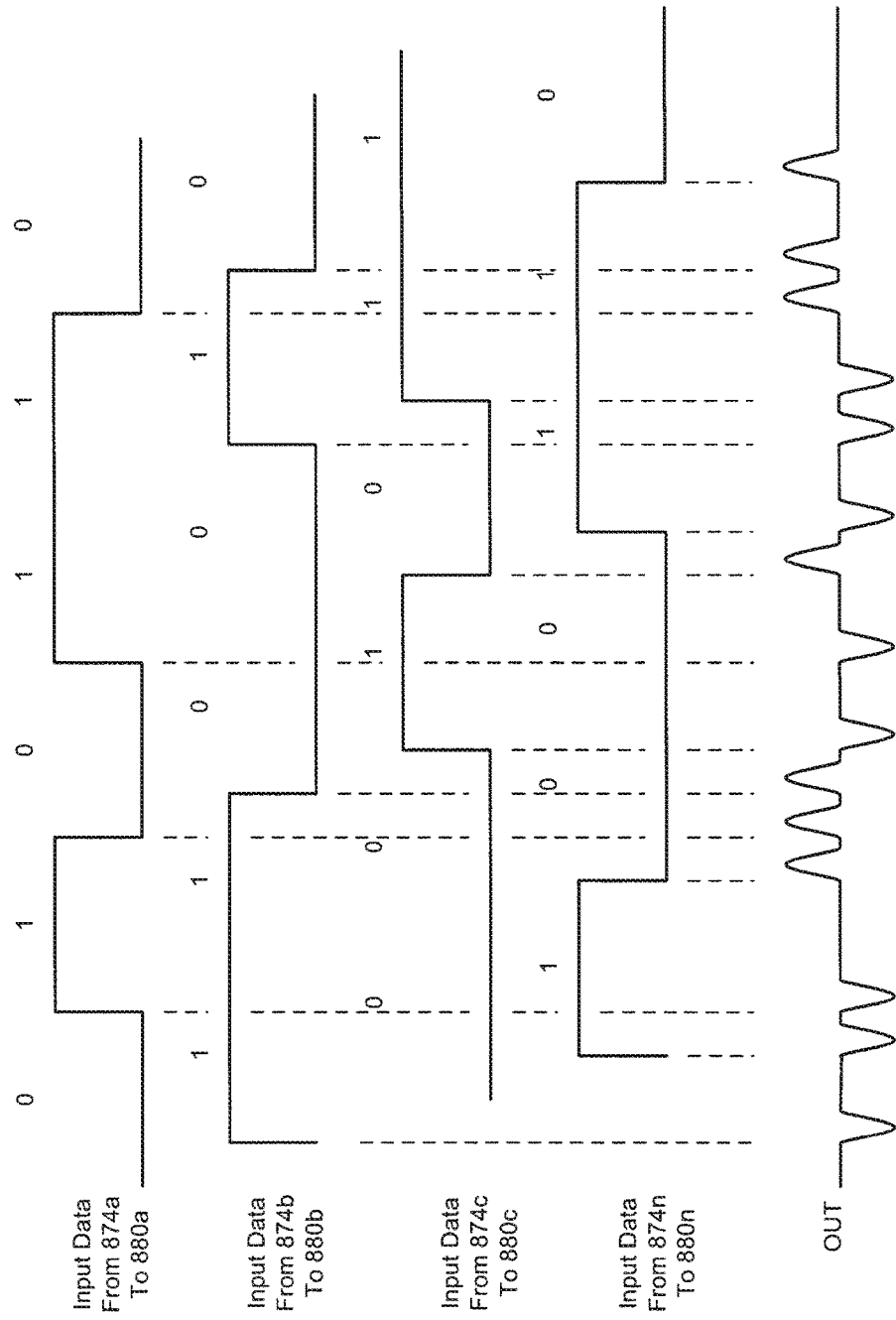

MULTI-DIE MEMORY DEVICE

CROSS-REFERENCE TO RELATED APPLICATIONS

This application is a Continuation of U.S. Ser. No. 14/797,057, filed Jul. 10, 2015, entitled MULTI-DIE MEMORY DEVICE, which is a Continuation of U.S. Ser. No. 14/278,655, filed May 15, 2014, entitled MULTI-DIE MEMORY DEVICE, which is a Continuation of U.S. Ser. No. 13/562,242, filed Jul. 30, 2012, entitled MULTI-DIE MEMORY DEVICE, which is a Continuation of U.S. Ser. No. 12/519,353, filed Jun. 15, 2009, entitled MULTI-DIE MEMORY DEVICE, issuing as U.S. Pat. No. 8,233,303 on Jul. 31, 2012, which claims priority under 35 U.S.C. §365 to International Application No. PCT/US2007/087359, filed Dec. 13, 2007, published as WO 2008/076790 A2 on Jun. 26, 2008, which claims priority under 35 U.S.C. §119(e) to U.S. Provisional Application No. 60/870,065, filed Dec. 14, 2006, entitled MULTI-DIE MEMORY DEVICE, all of which are incorporated herein by reference in their entirety.

TECHNICAL FIELD

The present invention relates to data storage technology.

BACKGROUND

Power consumption in dynamic random access memory (DRAM) devices has historically scaled in proportion to the product of signaling bandwidth and storage capacity. As more applications demand higher performance and higher capacity, DRAM power consumption is projected to increase dramatically, presenting substantial cooling challenges for system designers and making advances in signaling rate and capacity increasingly difficult.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 illustrates a portion of a inverter-based clock distribution circuit implemented in a conventional DRAM process and a counterpart inverter-based clock distribution circuit implemented in a high-speed logic process;

FIG. 4 illustrates a comparison between a conventional arrangement of a storage array coupled to a centralized I/O and an arrangement that may be used within the storage die of FIG. 1;

FIG. 5A illustrates an exemplary arrangement of storage arrays within a storage die and FIG. 5B illustrates a more detailed embodiment of a representative storage array within the arrangement of FIG. 5A;

FIGS. 16A and 16B illustrate an exemplary timing calibration operation that may be carried out by the interface die of FIG. 12 to determine an appropriate time delay between assertion of the demand signal and assertion of the corresponding read data sampling signal;

FIG. 17A illustrates a multi-die memory device having an interface die that provides one or more supply voltages to output drivers within a counterpart storage die to control the amplitude of output signals generated by the storage die;

FIG. 17B illustrates amplitudes of exemplary output signals generated by the storage die of FIG. 17A in response to different supply voltages from the counterpart interface die;

FIG. 18 illustrates a multi-die memory device having an interface die with built-in self-test circuitry and redundancy control circuitry;

FIG. 19 illustrates an embodiment of a multi-die memory device in which an interface die includes a power regulator to selectively power each of multiple storage arrays \ within a storage die;

FIG. 24 illustrates a timing circuit that may be used in conjunction with the multiplexer of FIG. 23; and FIG. 25 illustrates a timing diagram for the multiplexer of FIG. 23.

DETAILED DESCRIPTION

Figure 1:
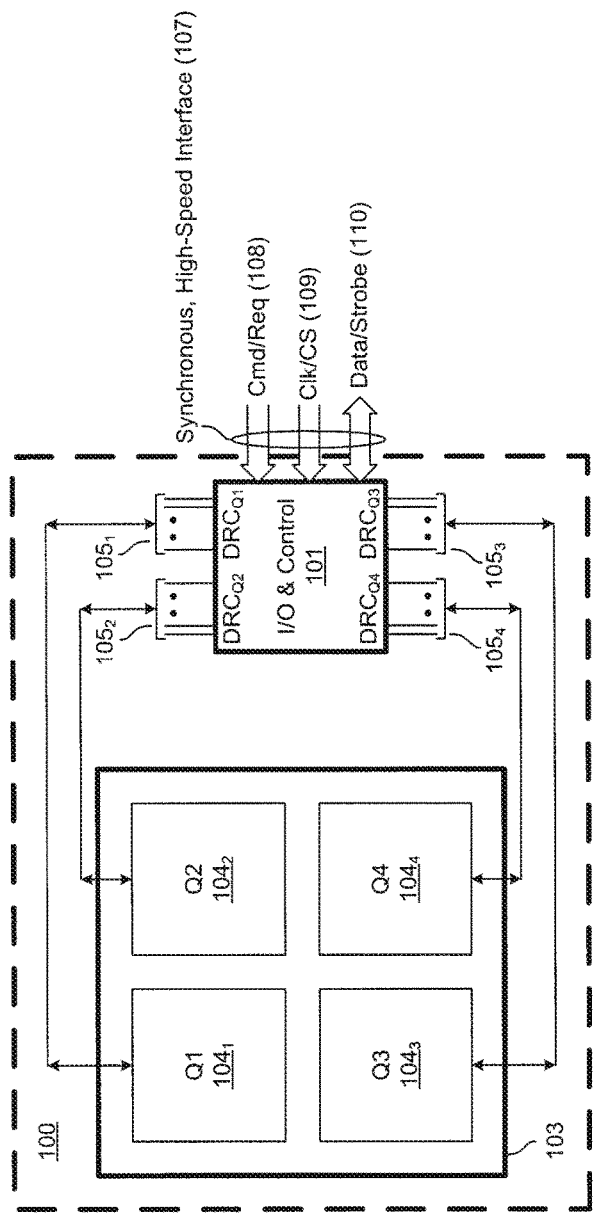
FIG. 1 illustrates an embodiment of an integrated circuit package having synchronous, high-speed interface and core storage functions split between an interface die and a storage die, respectively.

A memory device having storage and control functions split between separate integrated circuit dice within a multi-die integrated circuit package is disclosed in various embodiments. In particular, recognizing that compromises inherent in conventional DRAM fabrication processes yield relatively inefficient high-speed logic circuitry, reduced power may be achieved by relegating the high-speed circuitry that forms the control and signaling interface of a conventional memory device to a separate interface die that is fabricated using a process that yields power-efficient high-speed circuitry. With most or all of the high-speed circuitry removed, the core storage circuitry that remains on the storage die may be fabricated in a process that is more appropriate to balancing cell retention time and storage density, potentially saving additional power. Also, by disposing the interface die and the storage die in close proximity to one another within a common integrated circuit (IC) package (e.g., a multi-component package (MCP) such as a stacked package die, also known as a multi-die package (MDP), multi-chip module (MCM), system-in-package (SIP), etc.), a substantially larger number of die-to-die interconnections may be achieved than if each of the dice is enclosed within separate IC packages. In particular, in one embodiment, the larger number of die-to-die interconnects possible within a multi-die package are applied to establish a dedicated set of control and data signal paths between the interface die and each of multiple storage arrays within the storage die. In one embodiment, the intra-package data signal interconnects are disposed at a central region within each of the storage arrays of the storage die thus enabling substantially shorter bit lines to be used than in arrangements having bit lines that traverse the entire storage array, thereby increasing data retrieval speed and/or significantly reducing access power at nominal speeds.

In one embodiment, the interface die and storage die are disposed in a stack (i.e., one on top of another) on top of a multi-die package substrate. The top die in the stack, which may be the interface die or the storage die, may be wire-bonded to conductive traces or other conductive structures in the package substrate to establish connection to the bottom die. The bottom die may also be wire bonded to the conductive structures within the package substrate or may be coupled to the conductive structures via flip-chip arrangement or any other interconnection arrangement. In another embodiment, the interface die and storage die may be mounted side-by-side on the package substrate, and may be directly wire bonded to one another and/or flip-chip-interconnected or wire-bond-interconnected through conductive structures in the package substrate. There are many other embodiments in which the interface die is interconnected to the storage die using a variety of "3D packaging" technologies including, but not limited to, thru-silicon vias, flex-tape, die-in-substrate encapsulation, direct wafer bonding, proximity interconnect, and so forth. In any of these variants, the MCP may include an encapsulating structure or other housing disposed over the interface die and storage die to form an integrated-circuit (IC) package. Further, the separate interface and storage dice may cooperate to mimic the functional operation of conventional memory devices and the multi-die memory package may be form-factor and contact-compatible with such memory devices. Accordingly, the multi-die memory device may be disposed in place of conventional memory devices on memory modules, motherboards, or in any other application where conventional memory devices may be applied. Further, additional storage dice may be included within the multi-die memory device, each coupled to the interface die but omitting full-time clocked input/output circuitry and thus multiplying storage capacity without substantially increasing static power consumption. These and other embodiments are described in further detail below.

FIG. 1 illustrates an embodiment of an IC package 100 having synchronous, high-speed interface and core storage functions split between an interface die 101 and a storage die 103, respectively. The interface die 101, also called an I/O and control die, includes a high-speed interface 107 and multiple internal memory array interfaces $105_1$-$105_4$. In the embodiment of FIG. 1, the high-speed interface 107 is a synchronous interface that receives timing signals and memory access commands from an external memory controller (not shown), and that receives write data in conjunction with memory write commands and outputs read data in response to memory read commands. In a particular embodiment, the high-speed interface 107 may be designed to mimic the interface of a conventional memory device and thus may receive commands (or requests) via a command path 108 (Cmd/Req) synchronously with respect to a clock signal received via a clock/chip-select path 109 (Clk/CS), and may receive data via a data path 110 (Data/Strobe) in response to transitions of corresponding strobe signals (i.e., timing references) conveyed source synchronously with strobe lines within the data path 110. The high-speed interface 107 may additionally include timing circuitry such as a phase-locked loop (PLL) or delay-locked loop (DLL) circuitry to generate an internal clock signal based on a reference clock signal received via the clock path 109. In one embodiment, for example, the internal clock signal is used to sample command signals conveyed via the command path 108, and to generate strobe signals that are output via data path 110 in conjunction with read data, thereby providing a source-synchronous timing reference for establishing a read-data sampling time within the external memory controller. The timing circuitry within the high-speed interface 107 may additionally include phase adjustment circuitry to enable desired phase offsets between the internal clock signal and reference clock signal and/or between data signal sampling times and transitions in corresponding incoming data strobe signals.

In the embodiment of FIG. 1, each of the memory array interfaces $105_1$-$105_4$ ($DRC_{Q1}$-$DRC_{Q4}$) is coupled to a respective storage array $104_1$-$104_4$ within the storage die 103, and includes a relatively slow and wide data path (i.e., relative to the high-speed interface 107) that, in one embodiment, matches the column access width of the storage array, as well as an asynchronous command path for conveying row and column control signals to the storage array. That is, the command transfer from interface die 101 to storage die 103 is clockless (or un-clocked) in that no periodic clock signal is conveyed along with the row and column control signals, though one or more non-periodic strobe signals such as row-address-strobe (RAS) and column-address-strobe signals (CAS) may be issued to initiate address latching and corresponding memory access operations within the storage die. By minimizing the use of free-running or continuous clocking circuitry on the storage-die, and instead having the interface die provide a timing reference signal only when needed (e.g., during signal transmission between the storage die and the interface die) substantial power savings can be realized. A clocked command path (and corresponding clocked interface in the storage die) may be used for command transfer in alternative embodiments. The data signal transfer between the interface die 101 and storage die 103 may be timed by a clock or strobe signal, or may be transmitted asynchronously. In the case of asynchronous data transmission, sampling time within the interface die 101 and/or storage die 103 may be established deterministically with respect to transmission or receipt of row/column control signals.

In the embodiment of FIG. 1, the storage die 103 includes four independently accessible storage arrays $104_1$-$104_4$ (Q1-Q4 and also referred to herein as quadrants, though more or fewer arrays may be provided in alternative embodiments), each coupled to a respective one of the memory array interfaces $105_1$-$105_4$ within the interface die 101. As discussed in further detail below, the separate signaling paths between the storage arrays 104 and the interface die 101 enable the storage arrays 104 to be designed with substantially shorter data bit lines than in conventional memory devices that have a single multiplexed I/O node.

Figure 2:
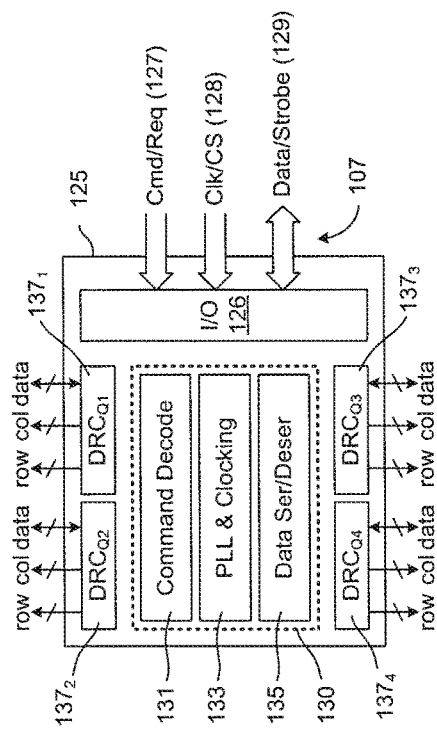
FIG. 2 illustrates an embodiment of an interface die that may be used to implement the interface die of FIG. 1.

FIG. 2 illustrates an embodiment of an interface die 125 that may be used to implement the interface die 101 of FIG. 1. As shown, interface die 125 includes I/O circuitry 126 that forms at least a portion of the high-speed interface 107 described above, and includes a command interface 127 to receive commands (or requests) from an external control device, a clock/chip-select interface 128 to receive a reference clock signal, clock-enable signal, chip-select signal and other timing and/or control-related signals (e.g., serial I/O signals that may be used to configure the operation of the high-speed external interface prior to normal device operation), and a data I/O interface 129 to receive write data signals and corresponding strobe signals and mask signals, and to output read data and corresponding strobe signals. The input/output circuitry 126 is coupled to a core logic block 130 that includes command decode circuitry 131 (referred to herein as a command decoder), timing circuitry 133 and data serializing and deserializing circuitry 135. In one embodiment, the timing circuitry 133 includes a PLL (a delay-locked loop or even open-loop delay line may alternatively be used) to receive the incoming reference clock signal and, when the clock-enable signal is asserted, to generate an internal clock signal (e.g., a frequency equivalent or frequency multiple of the reference clock) that is used to sample command signals arriving via the command path and to synchronize operations within the interface die 125, including data serializing and deserializing operations. More specifically, the internal clock signal generated by the PLL may be supplied to a clock tree that distributes multiple delay-matched instances of the clock signal to various other circuit blocks within the interface die 125, including the command decoder 131, data serializing/deserializing circuitry 135 and I/O circuitry 126.

The command decoder 131 buffers incoming memory access commands, determines which of the storage arrays 104 a given command is directed to, and converts the command into the row and/or column control signals needed to carry out the commanded operation. In one embodiment, for example, each incoming memory access command may be either a row command (e.g., an activation command or a precharge command) that includes bank and row addresses that uniquely identify a bank and storage row therein to be activated (or bank to be precharged), or a column command that includes bank and column addresses that uniquely identify the bank for which a row has been activated (i.e., contents of row transferred to set of sense amplifiers for the corresponding bank) and a column offset within the activated row. In the case of a row command, the command decoder converts the received bank and row address values into a set of row control signals and queues the row control signals to be output, in parallel, via an appropriate one of memory array interfaces $137_1$-$137_4$ (e.g., determined based on the bank address) a predetermined time (e.g., predetermined number of cycles of the internal clock signal) after the row command is received via the command interface 127. Note that in an embodiment in which a storage bank is partitioned between two or more memory arrays of the storage die (e.g. elements $104_1$-$104_4$ of FIG. 1), the row control signals may be queued for output to more than one of the storage arrays simultaneously (i.e., and thus, output via more than one of the memory array interfaces $137_1$-$137_4$). Similarly, in the case of a column command, the command decoder 131 converts the received bank and column address values into a set of column control signals and queues the column control signals to be output, in parallel, via one or more of the memory array interfaces $137_1$-$137_4$ a predetermined time after the column command is received via the command interface 127.

In the case of a memory write operation, write data and corresponding data mask information is received via the data I/O interface 129 and deserialized to form a more parallel (i.e., wider) write data word that is output to the storage die via the data path coupled to an address-selected one of the storage arrays (i.e., via the data portion of one of memory array interfaces $137_1$-$137_4$). As an example, in one embodiment, write data is received synchronously in a sequence of 32-bit data transfers via the data I/O interface 129, then deserialized to form a 128-bit write data word. The masking information (e.g., one mask bit per byte of write data) may be used to suppress output of selected bytes of the 128-bit write data word from the interface die 125, thereby preventing the corresponding column locations within the storage die from being overwritten with write data. Alternatively, the masking information may be supplied to the storage die which itself may include circuitry to prevent data write in the indicated column locations. With respect to read and write data timing, in one embodiment, the data serializing and deserializing circuitry 135 may include read and write data queues to introduce a desired latency between receipt of a write command via interface 127 and data transfer via the internal data path (i.e., write data transferred via the data portion of memory array interface 137) or data I/O path 129 (read data).

As discussed above, splitting the high-speed interface circuitry and core storage circuitry between separate integrated circuit dice obviates process technology compromises, making it possible to fabricate high-speed interface circuitry in processes that yield faster, lower-gate-capacitance transistors and enabling the core storage circuitry to be implemented in processes that balance cell density and retention. The timing circuitry 133 and high-speed I/O circuitry 126, in particular, tend to be come substantially more efficient when implemented in smaller-geometry processes. FIG. 3, for example, illustrates a portion of a inverter-based clock distribution circuit 140A implemented in a conventional DRAM process (e.g., an XXnm, dual gate-oxide DRAM process, where "XX" would be, for example, "90" for mainstream processes, 110 for trailing edge processes or 80 for leading edge processes) and a counterpart inverter-based clock distribution circuit 140B implemented in a high-speed logic process (e.g., a YYnm, 1P6M CMOS process, where "XX" would be, for example, "90" for mainstream processes, "130" for trailing edge processes, and "65" for leading edge processes). In the conventional DRAM process, inverter fan-out is generally more limited due to the slower, higher gate capacitance transistors and thus typically requires multiple inverter stages to achieve a desired fan-out. In the particular example shown, fan-out is constrained to two loads per inverter 141 so that, to achieve a total fan-out of eight, seven inverters 141 are used. By contrast, because of the faster switching speed and lower gate capacitance achieved within the smaller-geometry process, each inverter 143 may drive as many as eight loads so that a single inverter 143 may be used to provide the same signal drive capability as the seven inverters 141 in FIG. 3. Considering that all the inverters within the clock tree (and PLL and other interface circuitry) may be clocked near or above Gigahertz frequencies fulltime during normal operation, the multi-fold reduction in clock tree and PLL components represents a substantial power savings within the multi-die memory module.

Another benefit of splitting the high-speed interface and storage core between separate integrated circuit dice is that data I/O connections may be provided separately to each storage array on the storage die, thus avoiding the need to route bit lines for each storage array to a centralized I/O circuit, as is the case when I/O circuitry is disposed centrally between multiple storage arrays in a memory IC. This approach is especially advantageous when combined with a 3D stacking technology (e.g., flip-chip bonding, thru-silicon via, die-in-substrate encapsulation, etc.), and/or a lowpower, short-channel IO interface technology (e.g., ACcoupled interconnect), that does not require the memory array contacts to be positioned at the edges of the memory die. FIG. 4, for example, illustrates a comparison between a conventional arrangement of a storage array coupled to a centralized I/O circuit and an arrangement that may be used within the storage die 103 of FIG. 1. As shown, the bit lines 153 within the conventional storage array 151 extend across virtually the entire length of the storage array to couple storage cells 154 to a mid-die data I/O circuit 158. By contrast, in a storage array 161 that may be used to implement any of the storage arrays $104_1$-$104_4$ of FIG. 1, a dedicated data I/O circuit 165 may be provided and therefore may be disposed centrally within the storage array 161. By this arrangement, the bit lines of the storage array 161 may be split into two half-length bit line segments 163A and 163B that each extend from an outermost row of the storage array 161 to the centrally located (e.g., disposed at or near the midpoint between outermost rows) data I/O circuits, thereby roughly halving the capacitance of the storage array bit lines and thus reducing the time required to retrieve data from storage cells 164 in the outermost rows (the worst case and therefore limiting retrieval time) and also reducing power required to precharge the bit lines. Note that, while not shown in detail, the I/O circuit 165 may include sense amplifier circuitry and bank/column decode circuitry, or may be coupled to sense amplifier circuitry within individual storage banks of the storage array 161.

FIG. 5A illustrates an exemplary arrangement of storage arrays $187_1$-$187_4$ within a storage die 185 and FIG. 5B illustrates a more detailed embodiment of a representative storage array 187. In the embodiment shown, the storage die 185 includes four storage arrays $187_1$-$187_4$ (storage quadrants Q1-Q4), and eight storage banks, with each pair of cater-corner (i.e., diagonally opposed) storage arrays including the A and B segments, respectively, of a set of four storage banks. More specifically, odd-numbered storage quadrants Q1 and Q3 ($187_1$ and $187_3$) collectively include even numbered storage banks B0, B2, B4 and B6, with bank segments B0-A, B2-A, B4-A and B6-A being disposed within quadrant Q1 ($187_1$) and bank segments B0-B, B2-B, B4-B and B6-B being disposed within quadrant Q3 ($187_3$). Odd numbered storage banks are similarly disposed in A and B segments within quadrants Q2 and Q4 ($187_2$ and $187_4$). As in all other storage die embodiments described herein, there may be more or fewer storage arrays per storage die, and more or fewer storage banks per storage array. Also, each storage bank may span more or fewer storage arrays than shown in FIGS. 5A and 5B.

Turning to FIG. 5B, each of the storage arrays 187 includes a row decode circuit (not specifically shown) that responds to a bank-sense signal (BSense) by selecting one of the four storage bank segments $204_0$, $204_2$, $204_4$ or $204_6$ (specified by a two-bit row-bank select value, RBSel[1:0]), and activating one of 4096 rows therein specified by a 12-bit row address value, RAdr[11:0]. Together, the bank sense, row-bank select, and row address value constitute, at least in part, exemplary row control signals 200 (other embodiments may use different signals that achieve the same or similar functionality). More or fewer banks 204 per storage array 187 and/or more or fewer rows per bank 204 may be provided in alternative embodiments, in which case RBSel and RAdr values may have more or fewer constituent bits. In the row activation operation, the contents of the activated row are transferred to a bank sense amplifier circuit 207 to enable write and read operations in response to column control signals 201. More specifically, when a column-latch signal (ColLat) is asserted, the sense amplifier circuit 207 for the bank 204 specified by a column-bank select value, CBSel[1:0], is coupled via array bit lines 208 to a column decoder 210 (or column multiplexer) circuit disposed centrally within the storage array 187, and a column address value, CAdr[11:0], is applied to couple a selected one of 4096 columns of array bit lines 208 to a data I/O circuit 212, thereby enabling write data received via the data I/O circuit 212 to be driven onto the selected column of array bit lines 208 to overwrite data within the corresponding column of sense amplifiers within a bank-selected sense amplifier circuit 207, or enabling read data to be output from the column of sense amplifiers to the data I/O circuit 212 and thus output to the interface die. Together, the column-latch signal, column-bank select value, and column address value constitute, at least in part, exemplary column control signals 201 (other embodiments may use different signals that achieve the same or similar functionality).

Note that the individual storage arrays may be associated with different regions of a physical address space in a number of ways. For example, if there are sixteen storage arrays collectively within the set of storage dice, and the overall multi-die memory device is logically arranged as a four-bank device, then four storage arrays may be logically grouped together and associated with a single bank address. By this arrangement, a configurable number of storage banks may be established (e.g., through setting within a programmable register or other configuration circuit) and the total number of storage arrays dynamically allocated among each.

Figure 6A:
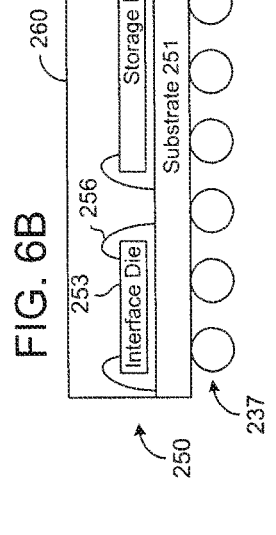
FIGS. 6A and 6B illustrate embodiments of multi-component packages having separate storage and interface dice.
Figure 6B:
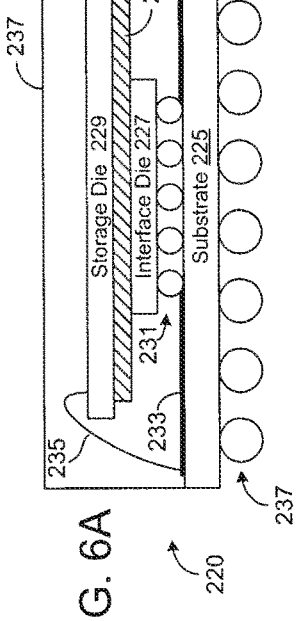

FIGS. 6A and 6B illustrate embodiments of multi-component packages 220 and 250 having separate storage and interface dice as described above. In the multi-component package 220 of FIG. 6A, the interface die 227 and storage die 229 are disposed in a stack on a multi-component package (MCP) substrate 225. In one embodiment, the substrate 225 is a non-conductive substrate having conductive vias therein to couple contacts of the interface die (the bottom die in the stack in this example) to ball grid array (BGA) contacts 237 for the multi-component package 220 (module contacts other than BGA may be used in alternative embodiments). The BGA contacts 237 may be soldered to counterpart landings on a daughterboard or motherboard (e.g., a memory module, blade, or motherboard of a data processing system, including various consumer electronics devices such as gaming consoles, mobile telephones, personal digital assistants (PDAs), cameras, audio and video rendering devices, etc.) and thus couple the multi-component package 220 to a larger electronics system. Within the multi-component package 220, the interface die 227 may be wire-bonded to vias, traces or other conductive structures formed on or within the substrate 225 or may be coupled to the conductive structures via micro-BGA 231 or other flip-chip die-interconnect technology. The storage die 229 is disposed on top of the interface die 227 to form the die stack, and may be isolated from the interface die 227 by a dielectric spacer 230. In the particular embodiment shown, the storage die 229 is wire-bonded (235) to conductive traces 233 disposed on the surface and/or sub-surface layers of the substrate 225, the conductive traces 233 extending to the contacts of the interface die 227 to establish the intra-package interconnection between the interface die 227 and storage die 229. Other 3D packaging approaches may be used to connect the interface die 227 with the substrate 225, including, without limitation, thru-silicon vias, flex-tape, die-in-substrate encapsulation, direct wafer bonding, proximity interconnect, and so forth, with and without associated die-thinning techniques. A housing or cover 237 formed from plastic, ceramic or other non-conductive material may be disposed over the substrate, covering and protecting the die stack and interconnection structures.

FIG. 6B illustrates an alternative embodiment of a multi-component package 250 in which an interface die 253 and storage die 255 are disposed side-by-side on a "System-in-Package" substrate 251. As in the embodiment of FIG. 6A, the substrate 251 may include conductive vias or other conductive structures to enable signal delivery via an external BGA 237 or other package interconnection technology, and may include conductive traces on the die-mount surface (or sub-surface layers) to which contacts on the storage die 255 and interface die 253 are wire bonded (258, 256) to establish die-to-die interconnection. The interface die 253, storage die 255 or both may alternatively be mounted in a flip-chip arrangement instead of being wire-bonded to the substrate conductors. Also, as in the embodiment of FIG. 6A, a non-conductive housing or cover 260 may be disposed over the substrate 251 to protect the dice and interconnections structures.

Figure 7A:
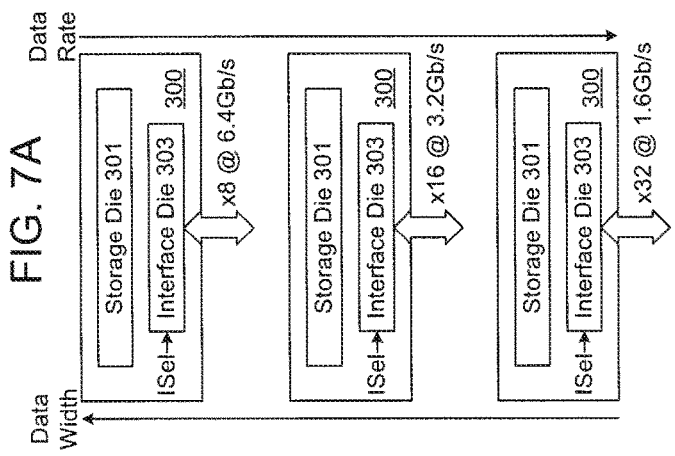
FIG. 7A illustrates an embodiment of a multi-die memory device having an interface die that may be configured at run-time or production time to establish a selected interface data width and data rate.

FIG. 7A illustrates an embodiment of a multi-die memory device having an interface die 303 that may be configured at run-time or production time to establish a selected interface data width, data rate, and electrical signaling levels. In the particular embodiment shown, the interface die may include a run-time programmable register, production-time programmable configuration circuit (e.g., fuse-programmable or anti-fuse-programmable circuitry) or input-signal configuration circuit (i.e., configuration determined by external inputs which may be strapped to high and low logic levels or delivered by another device) to enable selection between a 32-bit wide data interface at 1.6 Gigabit per second (Gb/s), a 16-bit wide data interface at 3.2 Gb/s or an 8-bit wide data interface at 6.4 Gb/s. Circuitry to support other data interface widths and/or data rates may be provided in alternative embodiments. However configured, an interface selection signal, ISel, may be provided to the interface die 303 to establish the interface characteristics, thus permitting the multi-die memory device to be applied in a variety of applications, for example, in place of various different conventional memory devices. Regardless of the selected interface characteristics, the interface die converts command and data signals as necessary to carry out data storage and retrieval operations within storage die 301, thereby enabling application of the same storage die 301 in a broad variety of applications and thus providing the potential for volume production savings. Note also that a single storage die design with multiple, independently accessible storage arrays can be combined and interfaced with many different interface die designs, each with the same type of "internal memory interface," but different types of "external memory interface" each specific to a particular DRAM memory type with different bank counts and/or burst lengths (e.g., one that interfaces to standard DDR3 memory interfaces, another that interfaces to standard GDDR4 interfaces, etc.) to again provide the potential for volume production savings. Also, as the storage die design is suitable to be co-packaged with multiple storage die, the composite device formed by, for example, a 5-die stack (one interface die plus four storage die) design could be achieved that mimics a very high density DRAM device currently unachievable in the storage die's fabrication technology (e.g., a 4 Gb composite DRAM device can be constructed using DRAM die built in a 1 Gb DRAM fabrication technology). Also, as the storage die can be independently accessed, multiple storage die can be simultaneously activated to provide sufficient "core bandwidth" to meet the needs of the interface die's external "I/O bandwidth" requirements (e.g., two storage-die, each with maximum per-die bandwidth of 1.6 GBps, can be combined with an interface die to form a composite memory device that delivers 3.2 GBps externally). Also, the same storage die design can be packaged together with a highly integrated system-on-chip application-specific IC (such as a cell phone processor chip) which has particular memory requirements addressed by this storage die design (e.g., very low active power, simultaneous read/write access to different storage arrays, etc.).

Figure 7B:
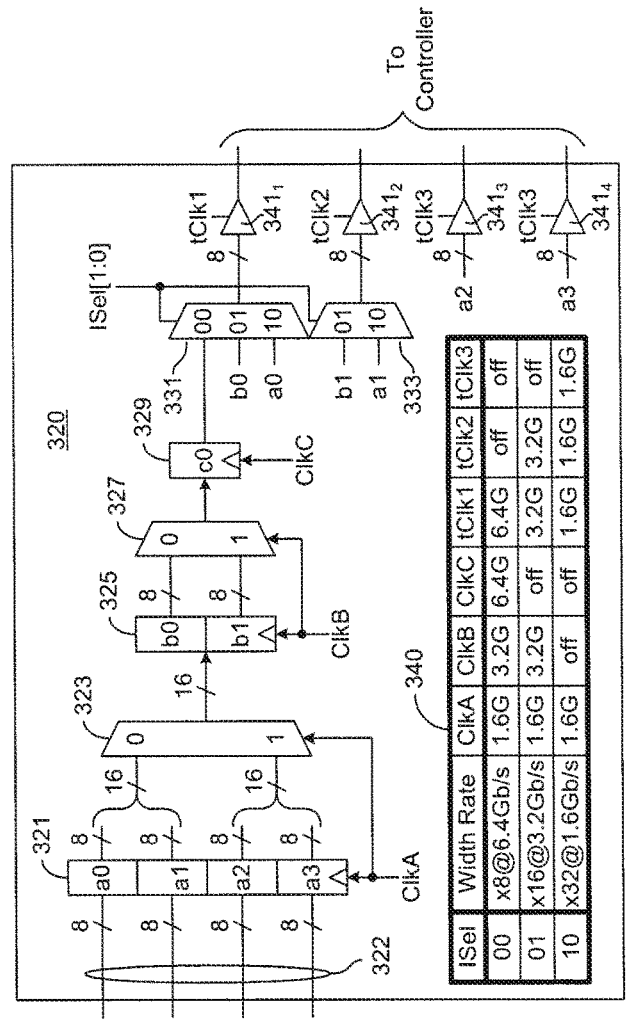
FIG. 7B illustrates an exemplary serializing circuit that may be provided within an interface die to support configurable serialization of read data returned from a storage die within a multi-die memory device.

FIG. 7B illustrates an exemplary serializing circuit 320 that may be provided within an interface die to support configurable serialization of read data returned from a storage die within a multi-die memory device. Though not specifically shown, a configurable deserializing circuit may be provided within the interface die to perform operations in reverse of those performed by the serializing circuit 320 and thus provide for read and write configurability of the high-speed interface data rate and data width. In serializing circuit 320, a 32-bit portion (322) of a read data value (e.g., a 128-bit or larger column data value returned from a storage device), including bytes a0-a3, is latched within a first-stage storage buffer 321 in response to clock signal, ClkA. Byte pairs a0/a1 and a2/a3 are supplied to respective input ports of multiplexer 323 which responds to the level of ClkA (high or low in a given half clock cycle) to pass byte pairs a0/a1 and a2/a3 alternately to a second stage, two-byte storage buffer 325. The second stage buffer 325 stores the byte pair forwarded in a given half cycle of ClkA in response to a clock signal, ClkB. ClkB oscillates at twice the frequency of ClkA so that both two-byte portions of the four-byte input 322 are stored per ClkA cycle. The two bytes stored within the second stage buffer, b0 and b1, are output to respective input ports of another multiplexer 327, which in turn responds to the level of ClkB to pass bytes b0 and b1 alternately to a third stage, single-byte storage buffer 329. The third stage buffer 329 stores the byte forwarded in a given half-cycle of ClkB in response to a clock signal, ClkC, having twice the frequency of ClkB so that all four of the originally received bytes a0, a1, a2 and a3 are stored in third stage buffer 329 in successive quarter-cycles of ClkA. As shown, the output of the third stage buffer 329 is provided, along with bytes b0 and a0 to respective input ports of output multiplexer 331, which receives a 2-bit interface select signal ISel[1:0] at a control input. Bytes b1 and a1 are similarly provided to respective input ports of output multiplexer 333 which also receives the interface select signal. By this arrangement, the setting of the interface select signal (which may be configured through run-time program control, production-time setting and/or input-signal control as described above) may be used to select c0, b0 or a0 to be output via byte transmitter $341_1$ and may similarly select bytes b1 or a1 to be output via byte transmitter $341_2$. Transmitters $341_3$ and $341_4$ are used to drive bytes a2 and a3, when used in a given interface configuration. As shown, transmitter $341_1$ is clocked by transmit clock tClk1, transmitter $341_2$ is clocked by transmit clock tClk2, and transmitters $341_3$ and $341_4$ are clocked by transmit clock tClk3. In this arrangement, each of the four byte transmitters $341_1$-$341_4$ is enabled to output a respective byte of a 32-bit output data value when the interface select signal indicates a x32, 1.6 Gb/s data interface. By contrast, when the interface select signal indicates a x16, 3.2 Gb/s data interface, byte transmitters $341_1$ and $341_2$ alone are enabled to output data, 3.2 Gb/s data interface and, when the interface select signal indicates a x8, 6.4 Gb/s data interface, byte transmitter $341_1$ alone is used to output data. Table 340 shows exemplary clock rates, and the interface width and data rate for given values of the interface-select value. For example, if the interface select is set to '00', a x8 data width and 6.4 Gb/s data rate are selected, in which case, ClkC oscillates at 6.4 GHz (6.4 G), ClkB oscillates at half that rate (3.2 G) and ClkA oscillates at half the clock B rate (1.6 G). Accordingly, a 32-bit data value 322 is loaded into the first stage buffer 321 every 625 nanoseconds (ns), with byte pairs a0/a1 and then a2/a3 being shifted into second stage buffer 325 in successive halves of the 625 ns input data interval, and finally with bytes a0, a1, a2 and then a3 being shifted into third stage buffer 329 in successive quarters of the 625 ns interval. Accordingly, transmit clock, tClk1 oscillates at 6.4 GHz to enable byte transmitter $341_1$ to transmit each byte of the four-byte sequence delivered via port '00' of output multiplexer at a 6.4 GHz data rate. Because byte transmitters $341_2$-$341_4$ are unused in x8@6.4 Gb/s mode, transmit clocks tClk2 and tClk3 may be disabled and thus are shown in table 340 as "off."

When a 16-bit data width at 3.2 Gb/s is selected (ISel[1:0]=01), third stage buffer 329 is unused and ClkC may be disabled as shown, while ClkA and ClkB continue to oscillate at 1.6 GHz and 3.2 GHz, respectively. In this arrangement, a 32-bit data value 322 is loaded into the first stage buffer in each 625 ns input data interval (i.e., while read data is being output), with byte pairs a0/a1 and then a2/a3 being shifted into second stage buffer in successive halves of the 625 ns input data interval, and delivered via the '01' ports of output multiplexers 331 and 333 to byte transmitters $341_1$ and $341_2$. As shown, transmit clocks tClk1 and tClk2 are both operated at 3.2 GHz to transmit each pair of bytes b0/b1 every 312.5 ns. Transmit clock tClk3 may remain disabled as byte transmitters $341_3$ and $341_4$ are unused in x16@3.2 Gb/s mode.

When a 32-bit data width at 1.6 Gb/s is selected (ISel[1:0]=10), both the second and third stage buffers are unused and ClkB and ClkC may be disabled as shown. ClkA oscillates at 1.6 GHz to load a new 32-bit data value 322 into first stage buffer 321 every 625 ns. Bytes a0 and a1 are delivered to byte transmitters $341_1$ and $341_2$ via the '10' ports of output multiplexers 331 and 333, and bytes a2 and a3 are supplied to byte transmitters $341_3$ and $341_4$. Transmit clocks tClk1-tClk4 are operated at 1.6 GHz to establish the 1.6 Gb/s data transmission rate.

Figure 8:
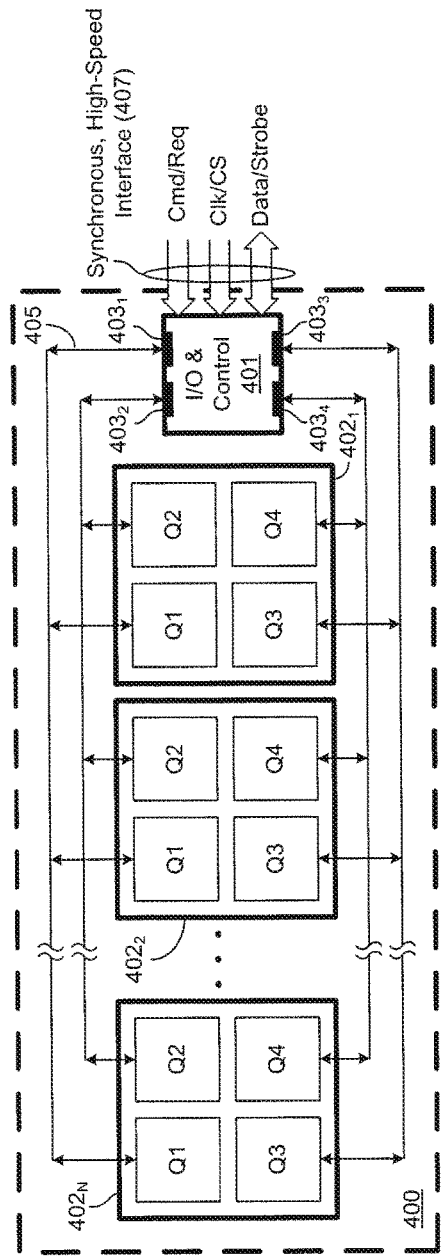
FIG. 8 illustrates an alternative embodiment of a multi-die memory device having multiple storage dice coupled to a shared interface die.

FIG. 8 illustrates an alternative embodiment of a multi-die memory device 400 having multiple storage dice $402_1$-$402_N$ coupled to a shared interface die 401. In the embodiment shown, each of the storage die 402 has an asynchronous (i.e., un-clocked or clockless) control interface as discussed above and thus consumes substantially less static power than conventional integrated circuit memory die that include on-chip high-speed synchronous interface circuitry. Accordingly, storage capacity within the multi-die module 400 may be increased multi-fold without corresponding multiplication of the overall device power consumption. In one embodiment, each of the memory control interfaces $403_1$-$403_4$ within the interface die 401 is coupled via a multi-drop control/data signal path 405 a respective storage array within each of the storage dice $402_1$-$402_N$. Additional device-select control signals may be generated within the interface die 401 (e.g., based on address information received via high-speed interface 407) to select one of the memory dice $402_1$-$402_N$ to respond to memory control signals on a shared path 405 during a given interval. Also, accesses to the memory dice 402 may be pipelined according to the deterministic data output times of the individual die 402 so that row operations (e.g., activation and precharge operations) may be performed in one or more of the memory dice 402 concurrently with column access operations (read or write operations) on one or more others of the memory dice 402. Also, instead of shared data and control signal paths 405, each of the storage arrays within each of the dice 402 may be coupled to the interface die 401 by a dedicated data path and/or control path.

Figure 9:
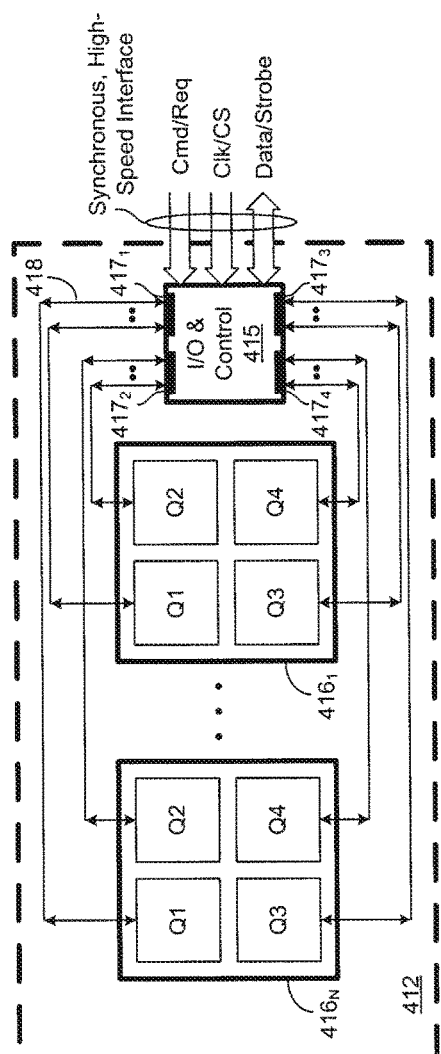
FIG. 9 illustrates an alternative embodiment of a multi-die memory device in which an interface die includes a dedicated set of data interfaces for each storage die.

FIG. 9 illustrates an alternative embodiment of a multi-die memory device 412 in which an interface die 415 includes a dedicated set of data interfaces for each storage die $416_1$-$416_N$. In the particular embodiment shown, for example, each storage die 416 includes four storage arrays (Q1-Q4), with like numbered storage arrays coupled via respective point-to-point (i.e., dedicated two transmission between two endpoints as opposed to multi-drop) data paths 418 to corresponding dedicated data interfaces within control ports $417_1$-$417_4$ of the interface die 415. More specifically, the Q1 storage array within each of memory devices $416_1$-$416_N$ is coupled via a respective point-to-point data path 418 to a respective data interface within control port $417_1$ of the interface die, and the Q2-Q4 storage arrays are likewise coupled to respective data interfaces within each of control ports $417_2$-$417_4$. Although not specifically shown in FIGS. 8 and 9, control signals (including row and column control signals, and row and column address values) may be communicated either asynchronously or in conjunction with a command timing signal (such as a clock or strobe signal) to each of the storage arrays via a dedicated point-to-point control path (i.e., control path per storage array), or via a multi-drop control path shared among all of the storage arrays, or via one of several multi-drop control paths that are shared by respective subsets of the storage arrays.

In one embodiment the total number of signaling interconnects (wires or other conductive structures) required to provide the point-to-point signaling paths 418 between the interface die and the DRAM die shown in FIG. 9 is reduced by time-multiplexing data transfer over the signaling paths. While this can be done in a straightforward manner for the unidirectional command and control interface (e.g., by using a conventional RAS/CAS DRAM control protocol), this presents particular challenges in the asynchronous storage dice 416 of FIG. 9 as there is no ready timing reference available to time the multiplexed, bidirectional data transfer. That is, in contrast to conventional synchronous storage devices which receive a free-running clock signal (and thus may output data and, in some cases, corresponding timing strobe signals in synchronism with the clock signal), a free-running clock is purposely omitted in the storage dice 416 of FIG. 9 to avoid power consumption during periods in which the storage dice 416 are not outputting data. In one embodiment, described in greater detail below, each of the storage dice 416 includes circuitry to output time-multiplexed read data in response to a signal, referred to herein as a demand signal, supplied by the interface die 415. That is, after issuing a data read command directed to a given storage array (or set of storage arrays), the interface die 415 delays a predetermined time that corresponds to the time required for the requested read data to be retrieved from the array core, and then issues, via one or more signal paths, a sequence of demand signals to enable the storage array to responsively output a corresponding sequence of data chunks (or segments or components) that collectively form the requested read data word. By enabling the storage die data driver circuits only in response to assertion of the demand signal, time-multiplexed data transmission may be achieved with substantially reduced power relative to embodiments in which a free-running timing source is provided to (or generated within) the storage die. In effect, substantial transmission-related power consumption occurs only when data is demanded by the interface die 415, rather than continually as in free-running clock embodiments.

Figure 10:
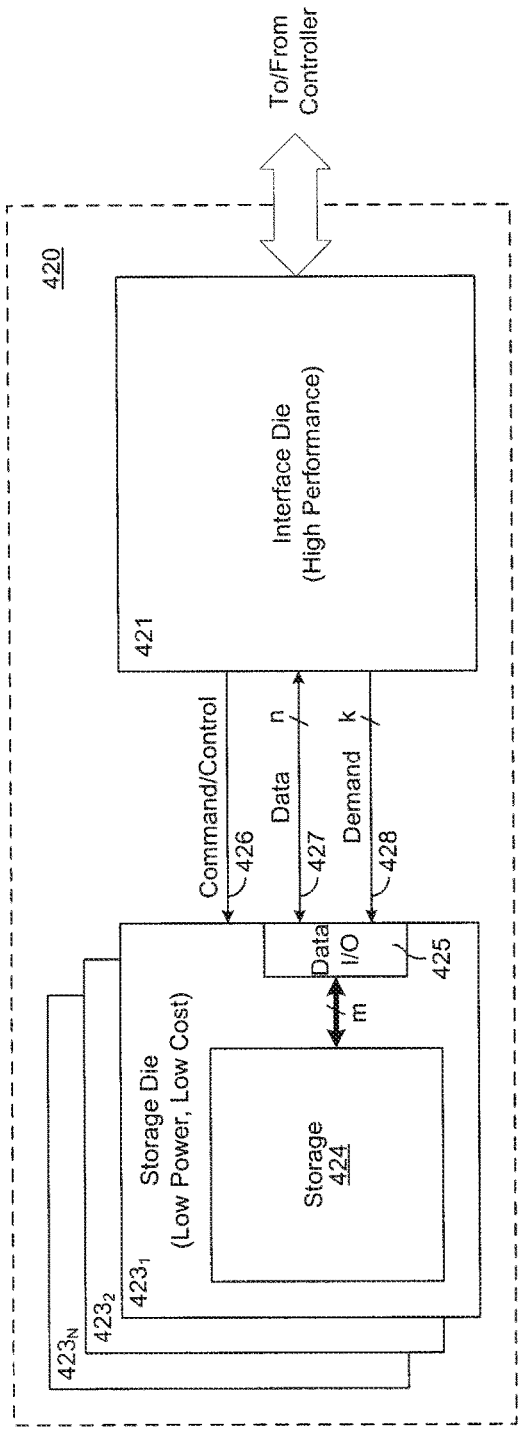
FIG. 10 illustrates an embodiment of a multi-die memory device in which an interface die outputs a demand signal to a selected one of multiple storage dice to enable read-data output.

FIG. 10 illustrates an embodiment of a multi-die memory device 420 in which an interface die 421 outputs a k-bit demand signal to a selected one of multiple storage dice 423$_1$-423$_N$ (or at least one such storage die) to enable read-data output. More specifically, the selected storage die 423 responds to incoming memory access requests (command/control signals) by carrying out the requested memory access within a storage core 424, then buffering the data for transfer in a data input/output (I/O) circuit 425. The buffered data may then be output in a stream of component values referred to herein as data units, with each data unit being transmitted in response to a respective edge of the demand signal. By this arrangement, all timing control and related circuitry may remain on the interface die 421, enabling the storage die 423 to be constructed simply and without power-consuming clocking circuitry, and yet the storage die 423 may still output data at rates that rival those of modern synchronous memory devices. As shown, the interface die 421 issues control signals to a selected one of storage dice 423$_1$-423$_N$ via command/control path 426, transfers data to and receives data from a selected storage die via data path 427 and issues demand signals to the selected storage die via demand path 428 (which may be a single signaling link). In one embodiment, the command/control path 426 may be coupled in multi-drop fashion to each of the storage dice 423$_1$-423$_N$, while dedicated, point-to-point data paths 427 and corresponding demand paths 428 are provided between the interface die 421 and each storage die 423. In alternative embodiments, point-to-point command/control paths 426 (or some portion thereof) may be provided between the interface die 421 and each storage die 423, and/or multi-drop paths may be used for data and/or demand signal transfer. Also, individual data paths 427, demand paths 428 and/or command/control paths 426 may be shared by subsets of devices, thus establishing a limited number of communication endpoints for each signaling path.

Figure 11:
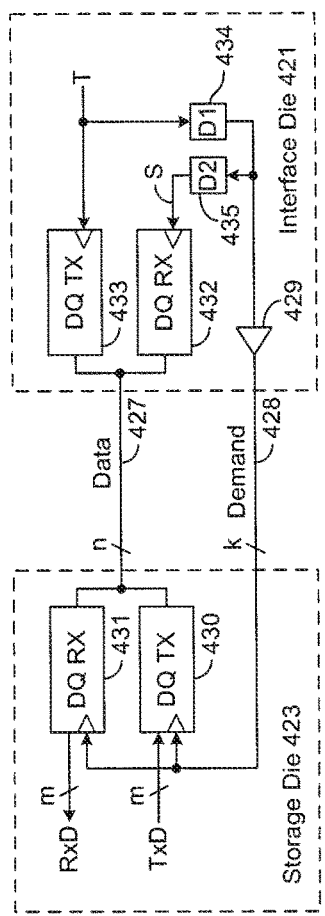
FIG. 11 illustrates an embodiment of a timing arrangement for bi-directional data transmission between the storage die and interface die of FIG. 10.

FIG. 11 illustrates an embodiment of a timing arrangement for bi-directional data transmission between storage die 423 and interface die 421 via data path 427. Referring first to data transmission from interface die 421 to storage die 423 (e.g., write data transmission), a timing signal (T) generated (or received) within the interface die 421 is supplied to a transmit circuit 433 which responds to edges in the timing signal by transmitting individual write data units via data path 427. The timing signal is supplied to (and propagates through) delay element D1, driven onto demand path 428 by demand-line driver 429, and then received within storage die 423 and supplied to data receiver 431 to time the sampling of the write-data units conveyed on data path 427. In one embodiment, the data receiver 431 performs a deserializing function by combining a sequence of n-bit data units received in response to edges of the timing signal into an m-bit received data value, RxD (m being greater than n). Delay element D1 may be calibrated at production time, device initialization time and/or adaptively during device operation to align transitions in the timing signal as received at the input of the data receiver 431 with a desired sampling point (e.g., data eye midpoint) for the data waveforms conveyed via path 427.

Still referring to FIG. 11, an m-bit read data value (TxD) is supplied to data transmitter 430 which, in turn, transmits a sequence of n-bit data units (each being a component of the m-bit read data value) onto data path 427 in response to a respective edge of a k-bit demand signal conveyed on demand path 428. That is, the interface die 421 outputs a demand signal to the storage die 423 and thus provides a timing reference for initiating data transmission within the storage die, effectively demanding each data-unit transmission. In the embodiment shown, the timing signal T propagates through delay element D1 (though D1 may be bypassed for demand signaling operation) and is driven onto demand line 428 by demand line driver 429, thus effecting demand signal transmission. The demand signal is supplied to data transmitter 430 within the storage die 423, with each transition of the demand signal (e.g., each high-to-low transition and/or low-to-high transition) used to trigger transmission of a respective data unit within the set of read data units that constitute the read data value TxD. In one embodiment, the delayed timing signal output from delay element D1 is supplied to a second delay element D2 to yield a sampling signal (S) that triggers sampling operations within data receiver 432 to sample the read data units output by storage-die data transmitter 430. As with D1, delay element D2 may be calibrated at production time, device initialization time and/or adaptively during device operation to align transitions in the sampling signal at the input of the data receiver 432 with a desired sampling point (e.g., data eye midpoint) for the data waveforms conveyed via path 427.

In one embodiment, the storage die 423 includes control circuitry, not shown, to enable operation of data receiver 431 and data transmitter 430 at different times according to command/control signals received from the interface die 421. For example, the control circuitry may enable the data receiver 431 to receive data in response to a timing signal conveyed via demand line 428 after receiving a data write command, and disable operation of the data transmitter 430 during the same interval. Similarly, the control circuitry may enable the data transmitter 430 to transmit data in response to demand signal transitions after receiving a data read command, disabling operation of the data receiver 431 during the same interval. On the interface die 421, similar control circuitry, responsive to read and write commands from a memory controller, may alternately enable the data transmitter 433 and data receiver 432 to carry out the requested data transfer operations. In alternative embodiments, rather than re-use the existing data and demand signal paths, separate timing signal paths may be provided for write data timing (e.g., a data strobe path to convey a source-synchronous data strobe signal) than are used for the demand signal associated with read data timing. Also, the particular delay element configuration and timing signal timing may be different from that shown in FIG. 11 and established by virtually any circuitry within the interface die 421 and/or storage die 423 that is capable of adjusting the phase of the outgoing timing signals (or timing signal used to initiate interface-die data reception or transmission) relative to data transmit intervals via path 427. Also, while the demand signal may consist of a single electrical signal with an oscillation frequency of the desired serialized data rate, it may also be realized by two or more phase-offset signals, which are combined within the output multiplexer circuit of the storage die to achieve the serialized data rate. Further, as shown in FIGS. 10 and 11, as many as k demand signals may be asserted to initiate transmission of n data values, where k ranges from one to n. In one embodiment, for example, the ratio of n:k is 8:1, such that one demand signal is asserted for each byte of data transmitted during a given transmission interval. Other ratios of n:k may be used in alternative embodiments.

Figure 12:
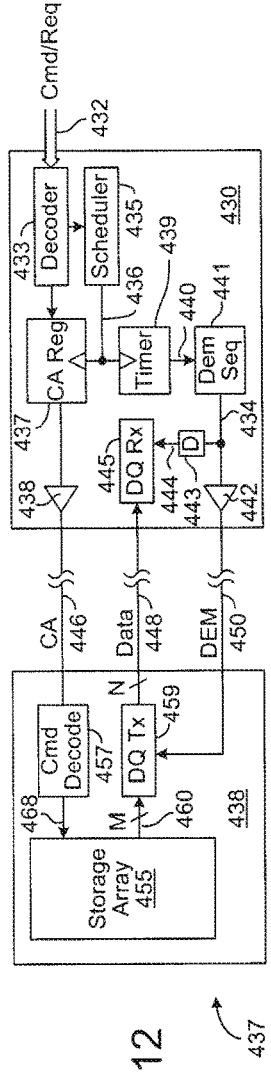
FIG. 12 illustrates a more detailed embodiment of a multi-die memory device in which a demand signal is used to effect time-multiplexed read data transfer between an interface die and a storage die.

FIG. 12 illustrates a more detailed embodiment of a multi-die memory device 425 in which a demand signal is used to effect time-multiplexed read data transfer between an interface die 430 and a storage die 431. Circuitry similar to that described in reference to FIG. 11 for timing and effecting write data transmission may be included within the interface die 430 and storage die 431 but, to avoid obscuring the read data path, is not shown. The interface die 430 includes a command decoder 433, scheduler 435, command/address register 437 (CA Reg), timer 439, demand sequencer 441 (Dem Seq) and delay element 443 (all of which may be included, for example, within the command decode logic 131 shown in FIG. 2) as well as a data receiver 445 which samples incoming read data in response to a sampling signal 444 (i.e., a delayed version of demand signal 434) supplied by the delay element 443. The storage die 431, which may be the sole storage die or one of multiple storage dice within a multi-die memory device, includes command decode logic 457 (Cmd Decode) to receive command and address information from the interface die via command/address path 446, and a data transmitter 459 (DQ Tx) to output read data to the interface die via data path 448 and in response to the demand signal 434 when driven onto demand path 450 (DEM) by driver 442. Note that the interface die 430 and storage die 431 both may include additional circuitry (not shown) to support data write transactions, configuration operations and any of the various other operations described above.

The command decoder 433 responds to memory access commands (or requests) received via host command path 432 by generating corresponding memory access commands and address values that are queued for transmission in command/address register 437 and eventually driven onto command/address path 446 by command/address driver 438. The command decoder 433 also signals the scheduler 435 to indicate command receipt and the nature of the command (e.g., read, write, configure, etc.) and thus enables the scheduler 435 to make decisions regarding the order and timing of command/data transmission to the storage die 431 and data receipt from the storage die. In particular, when a receipt of a memory read command is signaled by the command decoder 433, the scheduler 435 asserts a launch signal 436 after an appropriate time delay (which time delay may depend, for example, on previously issued commands the transactions for which are in progress) to advance the memory read command to the head of the command/address queue (i.e, within the command/address register 437) and enable the memory read command and corresponding address to be output via the command address path 446. As discussed, the command and address may be output concurrently via respective portions of the command/address path 446 or in two or more time-multiplexed transfers over the command/address path.

In the embodiment shown, the launch signal 436 is also supplied to the timer 439 which delays for a predetermined time that is set or calibrated to the elapsed time between receipt of the memory read command within the storage die 431 and output of corresponding read data from the storage array 455 within the storage die 431. After the predetermined time has elapsed, the timer 439 asserts a demand-enable signal 440 to enable the demand sequencer 441 to issue a sequence of demand signals 434. The demand signals 434 are supplied to the data transmission circuitry 459 of the storage die (i.e., via demand-strobe line 450) to enable transmission of a sequence of read data chunks and thus effect time-multiplexed output of a read data word 460 retrieved from the storage array 455 in response to the memory read command. The demand signals 434 are also supplied to the delay element 443 which generates, in response, a sequence of sampling signals 444 that are time delayed relative to the demand signals 434 according to the elapsed time between output of the first demand signal in the sequence and arrival of the first read data chunk at the data receiver 445. The sampling signals 444 are supplied to the data receiver 445 as shown to sample the incoming sequence of read data chunks and thus receive the read data word output from the storage array 455 in response to the memory read command. After the sequence of read data chunks has been received, the demand signal 434 may be held at a steady-state (e.g., parked at a high or low level or at a midpoint between high and low levels) until another read data transfer is to be effected, thus avoiding unnecessary state changes within the storage die 431 (i.e., as would occur in the case of a free-running clock signal or other continually toggling timing source) and conserving power.

Figure 13:
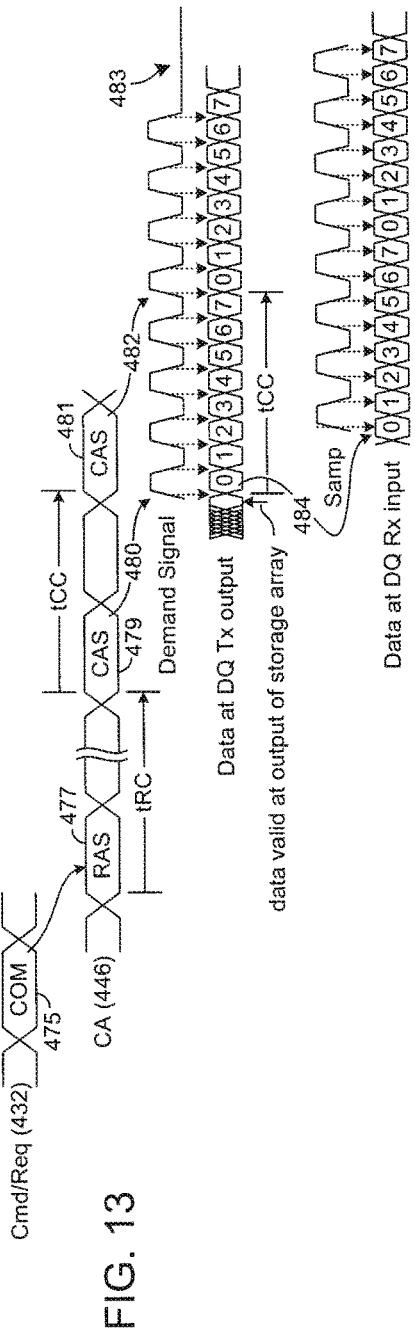
FIG. 13 illustrates an exemplary memory-read command sequence and corresponding read data transfer sequence within the multi-die memory device of FIG. 12.

FIG. 13 illustrates an exemplary memory-read command sequence and corresponding read data transfer sequence within the multi-die memory device of FIG. 12. As shown, a memory read transaction is initiated when a read command 475 (COM) is received via the host command path 432 in FIG. 12. Unless the read command is directed to an already activated storage row within the storage die, a row activation command 477 is issued to the storage die via command/address path 446 in response to the read command from the host. If the read command is directed to an already activated storage row, the activation command may be omitted. In one embodiment, the row activation command 477 includes a row address strobe (RAS) signal (and is thus also referred to herein as a RAS command) and may additionally include a row address, deasserted write enable signal and any other signals for specifying a row activation. A predetermined time, tRC (i.e., a row activation time specified for the storage array), after issuance of the row activation command 477, a column read command 479 is issued to the storage die via the command/address path 446. In one embodiment, the column read command 479 includes a column address strobe (CAS) signal (and is thus also referred to herein as a CAS command) and may additionally include a column address, deasserted write-enable signal and any other signals for specifying a column read command. A first predetermined time after issuance of the column read command, tCC (i.e., a memory core timing constraint specified for the storage die), a second column read command 481 directed to a different column address within the activated row of data may be issued via command/address path 446 to initiate a second read operation. Also, referring to FIGS. 12 and 13, a second predetermined time after issuance of the column read command 479 (which may be the same as or longer or shorter than tCC), a read data word 460 becomes valid at an output of the storage array 455 and therefore available to be latched within the data transmitter 459 and output from the storage die. As shown, the timer 439 within the interface die 430 is set or calibrated to assert the strobe-enable signal 440 at a time such that an initial rising edge of the demand signal edge (i.e., a first demand signal assertion) arrives at the data transmitter 459 of the storage die 531 shortly after (or coincidentally with) valid data output from the storage array 455. In one embodiment, the initial demand signal edge within a sequence or burst of demand signal edges latches the read data word 460 present at the output of storage array 455 within a word latch circuit of the data transmitter 459 and also enables a selected chunk of the data word to be driven onto data path 448. Subsequent demand signal assertions, including falling-edges and rising edges of the demand signal are used to select remaining chunks of the data word to be driven onto data path 448 in sequence (i.e., one after another) as shown at 480, thereby effecting time-multiplexed transmission of the entire read data word 460. In the particular example shown, eight chunks of read data, numbered 0-7, are transmitted in succession (effecting an 8-chunk data burst) in response to eight transitions of the demand signal to effect time-multiplexed transmission of the read data word 460. More or fewer demand signal transitions may be generated by the demand sequencer 441 in alternative embodiments to achieve smaller or larger burst lengths (i.e., more or fewer chunks per read data word transmission) or serialization ratios. Also, the burst length may be established by a one-time or reconfigurable setting within the interface die 430 (e.g., a programmable register setting). Further, while rising and falling edges of the demand signal are depicted as triggering data chunk output at the storage die, rising edges only or falling edges only may be used to trigger data chunk output in alternative embodiments. Also, while the demand signal is shown in FIG. 12 as a single electrical signal with an oscillation frequency of the desired serialized data rate, it may also be realized by two or more phase-offset signals, which are combined within the output multiplexer circuit of the storage die to achieve the serialized data rate.

Still referring to FIG. 12, the second CAS command 481 results in assertion of an additional demand signal sequence and corresponding 8-chunk output data burst as shown at 482. Additional CAS commands may be issued to effect additional back-to-back output data bursts. Also, as shown at 483 (during intervals in which no read data is to be transmitted), the demand signal may be parked at a logic low or high level to disable latching and data transmission operations within the storage die. The demand signal may also be parked at midpoint or other level between the logic low and high levels and, if desired or necessary, a preamble and/or postamble protocol established to indicate transmit-enable edges (i.e., edges that are used to enable latching and/or transmission operations within the storage die).

As discussed above, the sampling signal 444 (Samp) output by the delay element 443 is a time-shifted version of the demand signal, delayed according to the time required for data to propagate through the storage die output circuitry (i.e., data transmitter 459) and across the data path 448 to the data receiver 445. The delay of the sampling signal relative to the demand signal may also include a quadrature delay component to establish the sampling signal transition at the midpoint of incoming data eyes as shown at 484, thus ensuring that each data chunk conveyed in the incoming data signal is sampled during a data valid interval. Techniques for calibrating the delay element 443 to provide a desired timing relationship between the sampling signal 444 and incoming data are discussed below.

Figure 14:
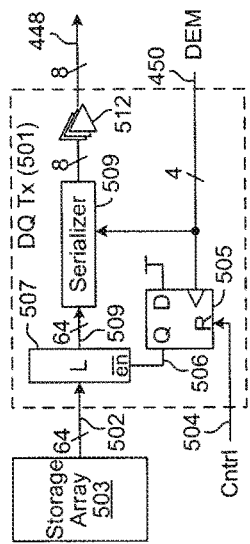
FIG. 14 illustrates an embodiment of a data transmit circuit that may be used to implement data transmitter of FIG. 12.

FIG. 14 illustrates an embodiment of a data transmit circuit 501 (DQ Tx) that may be used to implement data transmitter 459 of FIG. 12 and its interconnection to a storage array 503 and demand path 450. In one embodiment, the command decoder within the storage die generates a control signal 504 (Cntrl) in response to each CAS command after allowing any ongoing output data burst from a preceding CAS command to be completed. The control signal 504 is supplied to an asynchronous reset input (R) of a flip-flop 505 or other bi-stable device to lower a latch enable signal 506 (the flip-flop output) and thus a transparent mode (i.e., data flow-through) in latch 507. By this operation, when a READ data word 502 (depicted as a 64-bit value in the embodiment of FIG. 14, though larger or smaller data words may be output from the storage array) becomes valid at the output of storage array 503, the data word flows through the latch to the input of serializer 509. In the particular embodiment shown, the demand path 450 is coupled to the clock input of flip-flop 505 and to serializer 509. The data input of the flip-flip 505 is tied high so that, at the initial rising edge of a sequence of demand signal transitions, the flip-flop drives latch-enable signal 506 high to latch the read data word 502 within the transparent latch, thus maintaining availability of the read data word 502 for time-multiplexed transmission and at the same time enabling a subsequent memory transaction (e.g., a pipelined memory read or write operation) to be carried out within the storage array 503.

Still referring to FIG. 14, the serializer 509 performs a parallel-load, serial-shift function, enabling each of multiple chunks of the latched data word (i.e., read data word within latch 507) to be output onto the external data path 448 (e.g., by output driver 512) in succession to effect time-multiplexed transfer of the entire read data word. In the implementation shown, the serialization data rate (i.e., relative to a system clock source, not shown) is controlled by the demand signal rate, and not by a timing signal synthesized by the storage die. In the particular embodiment shown, the serializer 509 supplies a sequence of eight byte-size data chunks (i.e., 8-bit values) to eight output drivers (collectively designated 512) in response to rising and falling edges of demand signals on each of four demand signal lines within demand path 450. For example, each of the output drivers 512 may receive a respective one of the four demand signals and, on each transition of the demand signal (i.e., each rising edge and each falling edge), the output driver transmits a bit onto a respective line of data path 448. By this operation, after eight transitions on each of the four demand signals, the entire 64-bit input word has been transmitted from the storage die to the interface die, where the actual data rate of that transmission is controlled by the interface die (i.e., by establishing the toggling rate of the demand signals). Note that longer or shorter burst lengths of differently sized chunks may be output in accordance with application requirements (e.g., chunk size may be programmed within the storage die and/or burst length may be programmed within the interface die). Also, though not specifically shown, the output drivers 512 may be enabled by assertion of the latch-enable signal (or a delayed version thereof) and tri-stated at other times to enable bi-directional data transfer over the external data path 448. Also, the output drivers 512 may be integrated within the serializer 509 in alternative embodiments, as where multiple output drivers are enabled in succession to drive respective chunks of the latched data word onto the external data path. Also, as described previously, the demand signal as provided by the interface die to each output driver may consist of a single signal with a transition frequency at the desired serialized data rate, or it may consist of two or more phase-offset signals which collectively provide phase-offset transitions that correspond to the desired serialized data rate.

Figure 15:
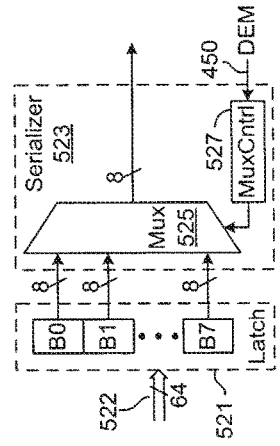
FIG. 15 illustrates embodiments of a serializer and latch that may be used to implement the serializer and latch of FIG. 14.

FIG. 15 illustrates an alternative embodiment of a serializer 523 and latch 521 that may be used to implement the serializer 509 and latch 507 of FIG. 14. Latch 521 includes a parallel input 522 to receive a 64-bit data word from a storage array (larger or smaller data words may be latched in alternative embodiments) and latches the data word in response to a high-going latch-enable signal (not shown). Latch 521 outputs eight data bytes (8-bit chunks) B0-B7 in parallel to the serializer 523 (as discussed there may be more or fewer chunks each having more or fewer constituent bits). The serializer 523 includes a multiplexer 525 and control circuit 527 (MuxCntrl) which cooperate to output each of the input data bytes in turn to each of the driver circuits or, if the multiplexer includes driver circuitry, onto an external signal path. In one embodiment, for example, the control circuit 527 responds to an initial transition of the demand signal by enabling a first output driver within multiplexer 525 to output byte B0 onto the external signal path, and then to a subsequent transition of the demand signal by disabling (e.g., tri-stating) the first output driver and enabling a second output driver within multiplexer 525 to output byte B1 onto the external signal path. Thereafter, subsequent transitions of the demand signal result in like disabling of the currently active output driver and enabling of the output driver for the next byte in the data transmission sequence. The individual output drivers may be coupled in a wired-OR to the output contact. In an alternative embodiment, the control circuit 527 may issue a sequence of multiplexer control signals to the multiplexer 525 to switchably pass each of the input bytes, in sequence, to a shared output driver (not shown in FIG. 15) for transmission in successive time intervals. In one embodiment, multiplexer 525 is implemented by a pulsed signaling multiplexer as described in greater detail below.

As discussed in reference to FIG. 12, a timing calibration may be performed to enable the interface die to determine the appropriate time delay between assertion of a demand signal and assertion of a corresponding sampling signal to sample the read data value output in response to the demand signal. FIGS. 16A and 16B illustrate an exemplary timing calibration operation that may be carried out by the interface die 430 of FIG. 12 to determine an appropriate time delay between assertion of demand signal 434 and assertion of read data sampling signal 444. In general, the approach of FIGS. 16A and 16B involves sweeping the delay setting (and thus the propagation delay) of delay element 443 through a sequence of delays to identify a range of delay settings within which data may be reliably read from the storage die 431 and then establishing a desired timing offset at the midpoint within the range. In one embodiment, a known data pattern is read from the storage die 431 (e.g., from a pre-loaded register, a hardwired test value, or pre-loaded location within the storage array 455) and compared with the expected value to determine a pass or fail result for each delay setting. Referring to FIG. 16A, then, at 551 a minimum timing offset (i.e., delay setting) is established within the delay element, and then the known data pattern is read at 553. The read data is compared with expected data in decision block 555 and, if no match is detected, the timing offset is advanced at 557 and the data read and compare operations at 553 and 555 are repeated. Note that the data read operation at 553 may involve numerous reads to ensure that, if a match is detected, the match is not a statistical aberration or that the timing offset is so near the edge of the desired range that one or more subsequent data reads at the same timing offset will yield failing results.

Referring to FIGS. 16A and 16B, the timing offset is iteratively advanced from the minimum timing offset 579 until, when a data match is finally detected at decision block 555, a lower timing offset is reached 571. At this point, the lower timing offset is recorded in a temporary register at 559, the timing offset is advanced at 561 and data read and compare operations 563 and 565 are performed to determine whether an upper timing offset has been reached. That is, if a data mismatch is not detected at 565, then the timing offset is deemed to remain in the passing range (between lower timing offset 571 and upper timing offset 572 as shown in FIG. 16B) and the timing advance, data read and compare operations (561, 563, 565) are repeated iteratively until a data mismatch (i.e., failing result) is detected. When a data mismatch is detected, the timing offset applied just prior to the mismatch detection (i.e., the most advanced timing offset at which no data mismatch occurred) is recorded as the upper timing offset at 567, and then a final desired timing offset is determined at 569 based on the upper and lower timing offsets. In the particular embodiment shown, for example, the upper and lower timing offsets are averaged to determine a desired timing offset 575 at the midpoint of the passing range (e.g., as shown in FIG. 16B), though the upper and lower timing offsets may be applied in various alternative ways to establish desired timing offsets that are advanced or delayed relative to the midpoint of the passing range. In any case, after the desired timing offset is determined, the desired timing offset is applied within the delay element 443 to control the delay between outgoing demand signal edges and corresponding edges of the receive data sampling signal.

Depending on the system timing margin, the calibration operation of FIGS. 16A and 16B maybe performed during system production to establish a one-time programmed delay value, or may be performed one or more times during device run-time to establish a dynamically controlled delay value. For example, in one embodiment, the calibration operation may be performed at device startup to establish the desired timing offset, and then left alone thereafter or repeated periodically or in response to certain events. In a particular implementation, for instance, the calibration operation may be carried out as frequently as necessary to compensate for temperature and voltage-induced timing drift and/or may be performed concurrently with refresh operations or other maintenance operations within the storage die. Also, while a linear search has been described (i.e., stepping the timing offset incrementally through a range of values), various alternative approaches for determining a desired timing offset may be applied, including binary or other non-linear searches, coarse/fine searches (i.e., coarse-stepping of the timing offset to identify the pass/fail boundaries at either end of the passing range, followed by fine-stepping of the timing offset within the coarse steps across the boundaries), and techniques that seek to minimize bit error rate or optimize other statistical results. Also, while calibration of the delay imposed by delay element 443 has been described, similar calibration operations may be carried out to determine the time delay imposed by timer 439 (i.e., how long to wait before asserting strobe-enable signal 440) or any other timing-dependent operations within the multi-die memory device. For example, the storage die 438 may contain a "feedback path" transmitter circuit, representative of the storage die's other transmitter circuits, which the interface die 430 can utilize within a closed-loop timing system to calibrate the required delay of delay-element 443. In other embodiments, to minimize the amount of timing calibration circuitry, the calibrated delay value for one chip-to-chip interface can be simultaneously applied to several other like chip-to-chip interfaces.

In multi-die memory device embodiments described thus far, the interface die is used to control timing and data access operations within one or more storage die. In those embodiments and others discussed below, the interface die may additionally include circuitry to control various other operational aspects of the storage die. Referring to FIG. 17A, for example, an interface die 601 may include a variable-output voltage regulator 605 (Signaling Voltage Regulator) to provide one or more supply voltages to output drivers within the storage die 603 and thus control the amplitude of output signals generated by the storage die 603. In the particular embodiment shown, the interface die 601 generates a supply voltage, $V_{SWING}$, which is provided to the storage die through contact 608 (or other interconnect structure) and used to power output driver 609, thereby enabling output driver 609 to generate waveforms having amplitudes determined by the interface die as shown in FIG. 17B (i.e., $V_{SWING}$ may be set to any of voltages $V_1$-$V_n$ to establish the output voltage swing impressed on line 612 via contact 610). In alternative embodiments, the interface die 601 may generate both upper and lower voltages used to power the output driver 609. Also, instead of providing a supply voltage, the interface die may source or sink a driver biasing current. Similarly, though an inverter-type output driver 609 is depicted, virtually any type of output driver may be powered by the interface die 601 including, for example and without limitation, differential or single-ended, current-mode or voltage-mode, AC-coupled or DC-coupled output drivers. In yet other embodiments, the interface die 601 may provide a control value that is supplied to one or more digital-to-analog converters (DACs) within the storage die 603 to generate one or more supply voltages or currents for controlling the common mode and/or signal swing of the storage die output drivers. The control value may be applied directly to the DAC(s) or may be stored within a programmable register or other configuration circuit within the storage die 603. With regard to calibration, searching strategies similar to that described in reference to FIGS. 16A and 16B (including variations thereof) may be used to determine a desired current and/or voltage supply level. For example, the supply voltage and/or current may be stepped through a range to identify a threshold at which data is reliably received, and then set to the threshold (multiplied by a safety factor, if desired). Also, though only a single supply output is depicted, the interface die 601 may generate multiple supply outputs for respective storage dice 603, or for output drivers associated with respective storage arrays within a given storage die, or even for individual output drivers or groups of output drivers associated with a given storage array.

To mitigate the "known good die" (KGD) problem (also known as the "compound yield" problem) generally associated with multi-die packages, the interface die within a multi-die memory device may also be used to control mapping of redundant rows and/or columns onto defective or suspect rows/columns of storage cells within a counterpart storage die. That is, in contrast to conventional techniques in which relatively large (and therefore expensive in terms of consumed die area) laser fuses or other one-time programmable structures are provided within a storage device to support production-time selection between a suspect row or column and a redundant counterpart, a much smaller programmable register or other run-time configurable structure may be provided within the storage die and loaded (i.e. programmed) with one or more redundancy control values at device startup. The redundancy information may be stored, for example, within a non-volatile storage circuit within the interface die or within another die (e.g., a separate non-volatile storage die within the multi-die package) that is coupled to provide the redundancy information to the interface die. Also, the storage die may receive the redundancy information in the form of control signals passed via the control interface (e.g., the interface used to issue row, column and other memory-related commands or requests) or via a separate interface. Referring to the embodiment of a multi-die memory device depicted in FIG. 18, for example, interface die 640 may include a built-in-self-test (BIST) engine 645 to execute various self-tests directed to circuitry on the interface die 640 and on storage die 641 (e.g., pattern generation, pattern comparison, memory write/read/modify tests, retention tests and various other tests similar to those performed at wafer sort, burn-in, and final test in conventional memory devices), and thus may identify defective or unreliable rows and/or columns of storage cells within storage die 641. In one embodiment, the BIST engine 645 issues programming instructions to the storage die (e.g., communicated by serial-port controller 647 to counterpart serial port controller 651 on the storage die 641) to establish settings within programmable register 653 to control the selection (shown conceptually by multiplexer 655) between defective/unreliable rows or columns (F) and redundant rows or columns (R). Defective or unreliable rows/columns within the storage die 641 may alternatively (or additionally) be identified during device production test and mapping between such rows/columns and their redundant substitutes programmed within an optional e-fuse bank (or other non-volatile storage, including on a non-volatile storage die co-packaged along with the interface die and the storage-die) of the interface die 640. In such an embodiment, the e-fuse redundancy mapping may be output to the storage die 641 at device startup (e.g., via serial port controllers 647 and 651) to establish settings within register 653 to control redundant row/column selection. In other embodiments, defective row/column information identified during production test can be stored within computing equipment associated with the production test environment. This defective row/column information can then be used to determine redundancy maps which are loaded into the final composite device's non-volatile storage during or after final assembly. In one embodiment, the multiplexers associated with each row repair domain (e.g., there may be one redundant row for every megabyte of DRAM storage array) are connected in shift-register series, thus forming a "scan chain" arrangement. To assign a row redundancy control value, the interface die may "scan in" (or shift in) the desired value. A similar approach can be used to control column redundancy multiplexers. In any case, relatively large, production-time programmable structures such as laser fuses may be omitted from the storage die 641 (or at least reduced in number) without sacrificing yield-enhancing redundancy features (additionally, if the non-volatile storage is re-programmable, a failing DRAM device can potentially be repaired in the field). Accordingly, a larger percentage of the die area is available for implementing the storage array 657 (and/or for additional redundant rows and/or columns of storage cells), thus potentially reducing the per-bit cost of the storage die 641.

FIG. 19 illustrates an embodiment of a multi-die memory device in which interface die 671 includes a power regulator 675 to selectively power each of multiple storage arrays $681_1$-$681_4$ within a storage die 673 (or multiple storage dice), thereby enabling unused storage arrays 681 to be switched off (i.e., powered down) to conserve power. In the embodiment shown, the interface die 671 includes an allocation map 677 that indicates which of the storage arrays 681 are in-use (i.e., used to store data) at a given time, and that outputs a set of enable signals 676 to the power regulator 675 to enable or disable power delivery to the storage arrays 681 accordingly. In one implementation, the allocation map 677 is cleared upon device power up, and then updated in response to host memory write commands. As memory write operations extend to each additional storage array 681 within storage die 673, the allocation map asserts the corresponding enable signal 676 for the storage array to enable power delivery thereto. In one embodiment, the interface die 671 may additionally receive deallocation notices or information from the host processor (or memory controller or other control entity) and may power-down storage arrays 681 in which all previously allocated memory space has been deallocated and thus are no longer in-use.

Still referring to FIG. 19, the allocation map 677 may indicate in-use regions of the storage die 673 with sufficient granularity to enable selective refreshing of storage rows therein. For example, in one embodiment, the allocation map 677 includes a number of array-map registers that correspond to respective storage arrays 681 within the storage die 673 (or storage dice), with each array-map register having a number of bits that correspond to respective rows of storage cells within the counterpart storage array. By this arrangement, individual bits of a given array-map register may be set or reset to indicate whether the corresponding storage row is in use (i.e., bits set or reset according to memory write requests and, if provided, deallocation notices from the host) and the in-use information 678 output to a refresh controller 679 to enable refresh operations to be bypassed for unused storage rows. Accordingly, refresh operations may be directed only to in-use storage rows, thereby saving power within the multi-die memory device relative to embodiments in which refresh operations are indiscriminately directed to all storage rows in sequence.

Figure 20A:
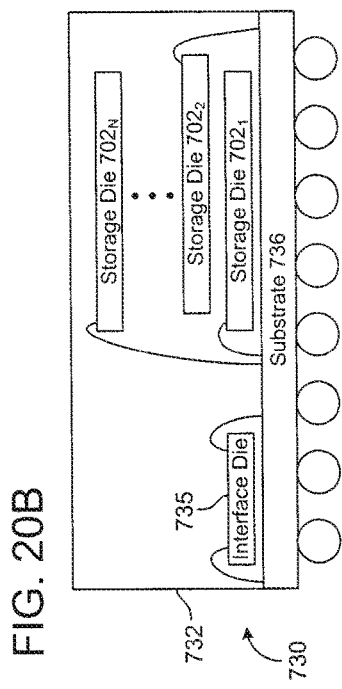
FIG. 20A illustrates an exemplary packaging arrangement that may be used to encapsulate a pair of storage dice within a multi-die memory device.

FIG. 20A illustrates an exemplary packaging arrangement that may be used to encapsulate a pair of storage dice $702_1$, $702_2$ within a multi-die memory device 725. As shown, the multi-die memory device 725 includes a module substrate 727 having conductive interconnection structures (e.g., traces, vias, etc.) generally as described in reference to FIGS. 6A and 6B. The interface die 701 and a first storage die $701_1$ are disposed on the substrate 727 and coupled to one another as described above (e.g., via wire bond or flip-chip interconnects), and a second storage die $702_2$ is disposed on top of the first storage die $702_1$ to form a die stack. A cover or housing 728 may be disposed over the dice 701, 702 and interconnection structures, and secured to the substrate 727. Though not specifically shown, a dielectric spacer may be disposed between the first and second storage dice to isolate the die from one another. Also, in an embodiment in which the first storage die $702_1$ is wire-bonded conductive interconnect structures in or on the module substrate 727, the first and second dice 702 may be offset from one another as shown (i.e., offset from a centerline that extends through the stack and normal to the substrate) to expose edges of the dice 702 for wire-bond access. As shown in embodiment 730 of FIG. 20B, additional storage dice $702_2$-$702_N$ may be added to the die stack (thus achieving a stack of dice $702_1$-$702_N$) and offset from one another to enable wire-bond access to each. A cover or housing 732 may be disposed over the interface die 735 and storage dice 702, and secured to module substrate 736.

Figure 20C:
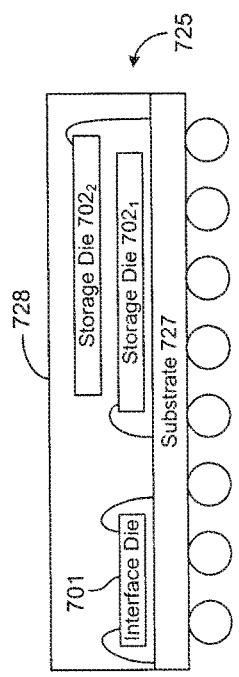
FIG. 20C illustrates another packaging arrangement in which an interface die and storage die are packaged separately in packages that mate to one another to form a multi-package module.

FIG. 20C illustrates another packaging embodiment 740 in which an interface die 745 and storage dice $702_1$-$702_N$ are disposed in separate integrated circuit packages 741, 743 that mate to one another to form a multi-package module. In this approach, the external, electrical interface protocol (i.e. the DRAM "flavor") can be selected at final assembly by the memory module manufacturer, rather than during memory die fabrication by the DRAM vendor. Although a package-on-package implementation is shown, a package-in-package arrangement may be employed in alternative embodiments. Also, a single storage die 702 may be disposed within the storage die package 741 instead of multiple storage dice 702 as shown. Further, instead of staggering the storage dice 702 to enable wire-bond access, other interconnection schemes and/or die stacking arrangements (including, but not limited to, thru-silicon vias, flex-tape, die-in-substrate encapsulation, direct wafer bonding, proximity interconnect) may be used. The package-to-package interconnections 747 may be established by direct electrical contacts (e.g., ball grid array, micro-ball grid array, spring contacts, pad-to-pad contacts and the like), or by contactless interconnects such as capacitive or inductive interconnects.

Figure 20E:
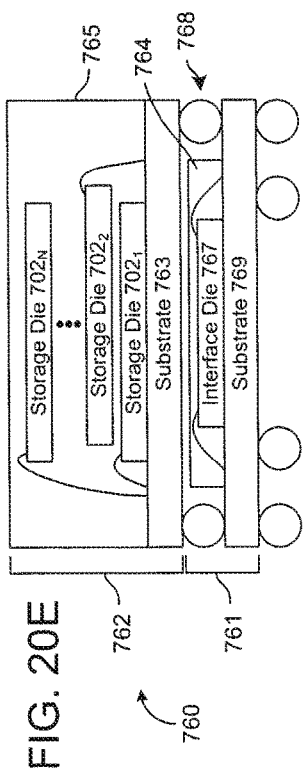
FIG. 20E illustrates a package-on-package embodiment having a storage package stacked on an interface package.
Figure 20B:
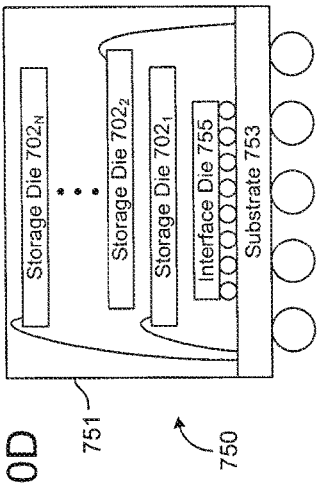
FIG. 20B illustrates an exemplary packaging arrangement that may be used to encapsulate a generalized number of storage dice within a multi-die memory device.
Figure 20D:
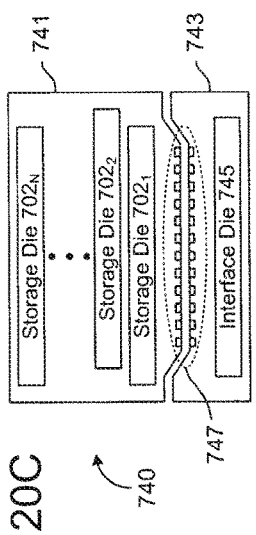
FIG. 20D illustrates another packaging embodiment in which an interface die is mounted in a flip-chip orientation to a module substrate.

FIG. 20D illustrates yet another packaging embodiment 750 in which an interface die 755 is mounted in a flip-chip configuration with contact pads mated via micro-ball-grid array or other contact technology to counterpart landings on a module substrate 753 and thereby interfaced (e.g., through traces on and/or within the module substrate 753) to wire-bond interconnections to one or more storage dice $702_1$-$702_N$ stacked above the interface die 755. The entire stacked die arrangement may be encapsulated within a housing 751, molding or other protective structure.

FIG. 20E illustrates a package-on-package (PoP) embodiment 760 having a storage package 762 stacked on an interface package 761. The storage package 762 includes a substrate 763 having storage die 7021-702N stacked thereon and encapsulated within molding or housing 765 as generally described above. The interface package 761 includes an interface die 767 wire-bonded or flip-chip mounted (or otherwise coupled) to substrate 769 and encapsulated within molding or housing 764. Solder balls 768 (or any other interconnection structures) may be used to form electrical contacts between the interface package 761 and storage package 762.

Figure 20F:
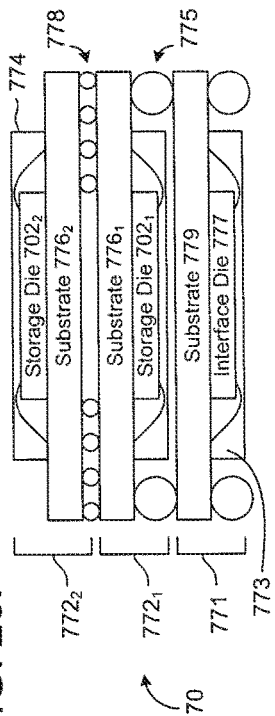
FIG. 20F illustrates another package-on-package embodiment having multiple storage packages stacked on an interface package.

FIG. 20F illustrates an alternative embodiment of a package-on-package embodiment 770 having one or more storage packages $772_1$, $772_2$ stacked on an interface package 771. In contrast to the embodiment of FIG. 20E, an interface die 777 is mounted on the underside of a substrate 779 (and optionally encapsulated within housing or molding 773) to form interface package 771, and storage die $702_1$ is similarly mounted on the underside of substrate $776_1$ in storage package $772_1$. By this arrangement, lower profile interconnects 778 (e.g., micro-balls or other low-profile interconnects) may be used to electrically couple the first-level storage package $772_1$ to second-level storage package $772_2$ and thus reduce package height relative to a device having a stack of same-orientation storage packages 772. One or more storage additional storage packages 772 (not shown) may be stacked on top of storage package $772_2$ to increase the overall package storage capacity. The storage packages 772 may be constructed generally as described in reference to FIG. 20E, each having a substrate 776 and at least one storage die 702 (each or any of the storage packages 772 may have multiple storage dice as, for example, in the embodiment of FIG. 20E) encapsulated within housing or molding 774. In the embodiment shown, electrical interconnections between the interface package 771 and first-level storage package $772_1$ may be formed, for example and without limitation, by solder balls 775 or other contacts.

Figure 21:
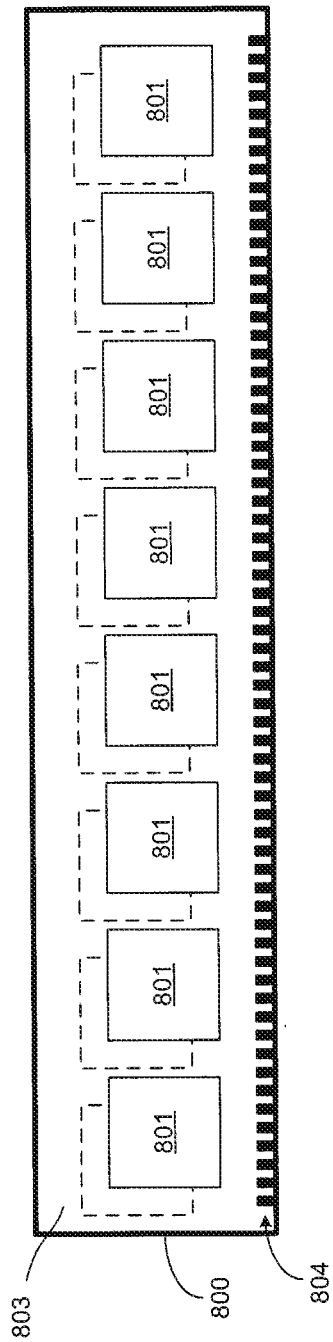
FIG. 21 illustrates an embodiment of a memory module having rows of multi-die memory devices disposed on front and rear faces.

FIG. 21 illustrates an embodiment of a memory module 800 having rows of multi-die memory devices 801 disposed on front and rear faces of a substrate 803 (the devices on the rear face of the substrate being shown in dashed outline). Traces disposed on the substrate 803 (including traces on submerged layers of the substrate) are used to convey signals between an edge connector 804 of the module and the multi-die memory devices 801. Because each of the multi-die memory devices 801 may be designed to mimic the operation of various conventional memory devices, the memory module 800 itself may be pin compatible with memory modules populated by conventional devices. Accordingly, the memory module 800 may be installed in connector sockets in place of conventional memory modules, for example to reduce power consumption and/or increase capacity within a memory system. Although eight multi-die memory devices 801 are shown on each face of the module 800, more or fewer devices may be provided according to interface or data width demands. For example, a ninth memory device 801 may be provided within each row to store error correction code (ECC) or other error-detection/correction data for the contents of the remaining memory devices 801 in the row. Also, while not specifically shown, a non-volatile storage such as a serial-presence-detect (SPD) memory may be disposed on the memory module to store characterizing information regarding the multi-die memory devices, including their programmable functions (e.g., interface programmability as described above), storage capacity, data rate capability and so forth.

Figure 22:
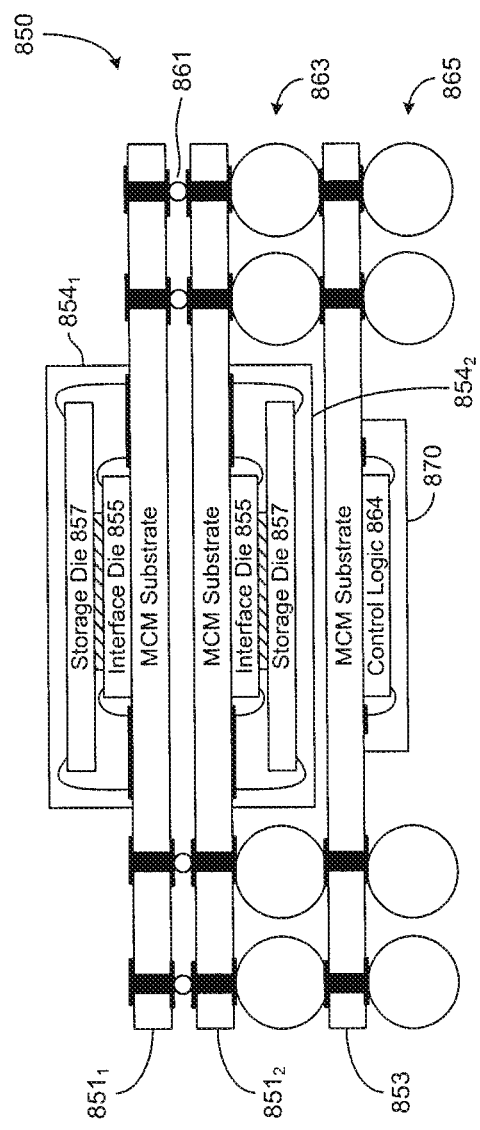
FIG. 22 illustrates a memory subsystem that includes a memory controller and a pair of multi-die memory devices disposed in a package-on-package arrangement.

FIG. 22 illustrates a memory subsystem 850 that includes a memory controller 870 and a pair of multi-die memory devices $803_1$, $803_2$ disposed in a package-on-package arrangement. In the particular embodiment shown, each of the memory devices 803 includes an interface die 855 and a single storage die 857 disposed in a stack as generally shown in FIG. 20D, though any of the multi-die memory device embodiments discussed above may alternatively be used, including those with multiple storage dice. Also, with respect to the package-on-package coupling via interconnects 861, the multi-die memory device $803_2$ is disposed in an inverted arrangement to take advantage of the cavity formed by module-to-module interconnection solder balls 863 and thus reduce the overall height of the package-on-package memory subsystem 850. The memory controller 570 includes a control logic die 864 that may be a dedicated memory controller, or an application specific integrated circuit (ASIC) that includes functions other than (or in addition to) memory control including, without limitation, cell phone baseband processor, graphics pipeline support, bus bridge, processor-local-bus interface and so forth. Alternatively, the memory controller 570 may be part of a general-purpose or special-purpose processor or controller. As shown, the memory controller 570 may also be disposed in an inverted configuration to take advantage of the cavity formed by module-to-circuit-board interconnection balls 865 and thus reduce the overall height of the package-on-package memory subsystem. Although not shown, a housing or other structure may be partially or completely formed or molded over the package-on-package arrangement of FIG. 22 to provide heat dissipation (cooling) and/or structural integrity.

In other embodiments, additional multi-die memory devices and/or other integrated circuit packages may be mounted in the package-on-package stack to provide additional memory capacity or other functionality. Also, while the interface die in the various embodiments described above has been described in terms of its function as an intermediary between one or more storage die and an external device such as a memory controller or processor or ASIC (application-specific integrated circuit) having a memory control function, the circuitry that constitutes the interface die may be implemented on the same die or in the same integrated circuit package as a memory controller, processor (e.g., a central processing unit, graphics processing unit, digital signal processing unit, etc.), ASIC or the like. As discussed, this allows potential cost savings to ASIC manufacturers by enabling a low-power DRAM design die design suitable for System-in-Package integration to also be shipped in high-volume, industry-standard DDR memory markets.

Figure 23:
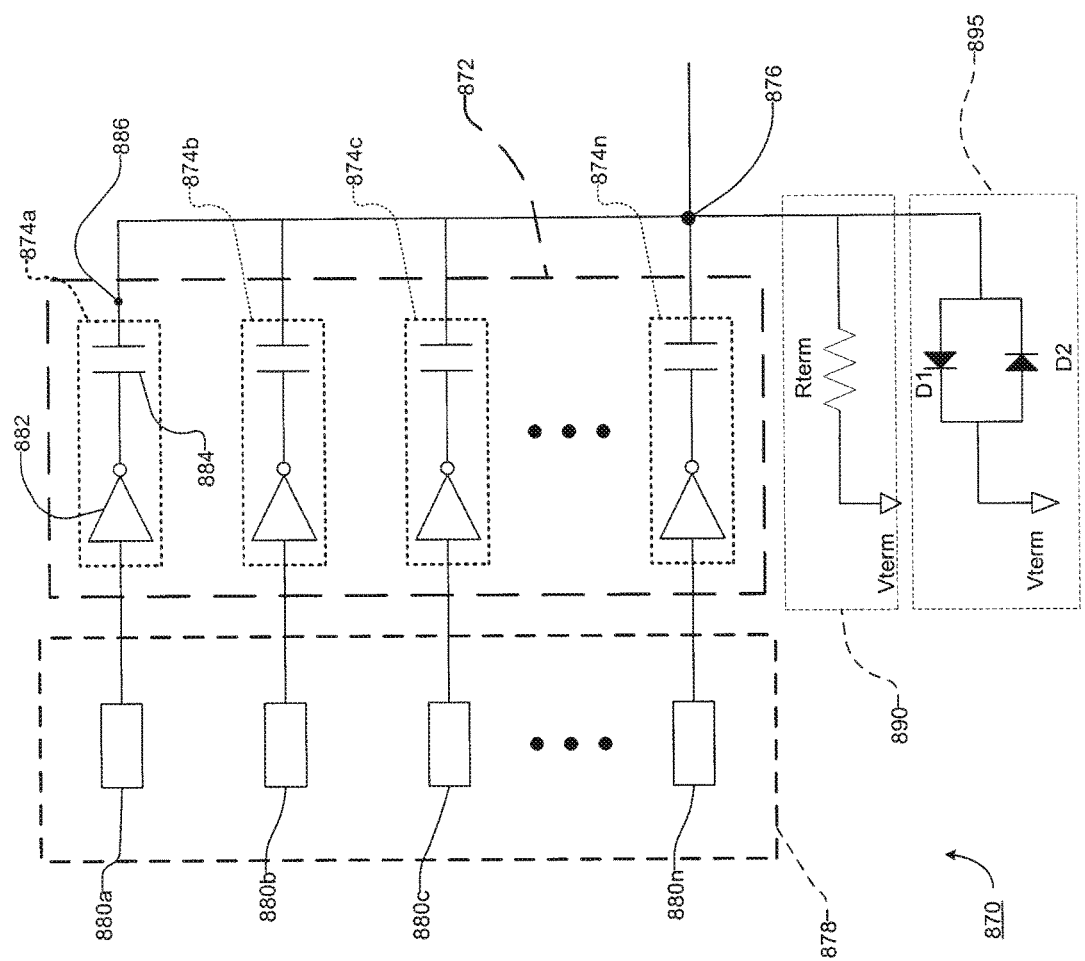
FIG. 23 illustrates a high-level block diagram of a pulsed signaling multiplexer that may be used to perform serializing operations and other functions within a storage die and/or interface die within a multi-component package or other multi-chip package.

FIG. 23 illustrates an embodiment of a pulsed signaling multiplexer 870 that may be used to implement output multiplexers and/or serializing multiplexers in the various integrated circuit devices and systems described above, including multiplexer 525 within the data serializing circuit of FIG. 15. As shown, multiplexer 870 includes timing circuitry 878 having a plurality of timing circuits 880a-n coupled to transmitter circuitry 872. The transmitter circuitry includes an array of AC-coupled transmitter circuits 874a-n that generate pulsed output signals. A common output node 876 receives the plurality of transmitter output signals in a time-multiplexed manner as more fully described below. By transmitting signals in this fashion, significant improvements in signal throughput and power efficiency for integrated circuits may be realized.

Still referring to FIG. 23, the plurality of AC-coupled transmitters 874a-n may be disposed in a parallel configuration with respective outputs tied together to the common output node 876. For purposes of clarity, only one transmitter 874a will be described in detail, it being understood that all of the transmitters may be substantially similar in construction. Each transmitter includes an amplifier circuit or driver 882 such as a CMOS inverter, for example. The output of the driver feeds an AC-coupling element such as a series capacitor 884 that includes an output terminal 886 for directing an AC output signal to the node 876. Each series capacitor 884 may have a capacitance on the order of around 50-150 fF (femto-Farads), and may be manufacturable through standard CMOS fabrication techniques. Moreover, it should be understood that, depending on the application, the on-die AC-coupling element may comprise a portion of a series capacitor, that for example, may cooperate with another portion of a series capacitor at a receiver end, or as part of the package assembly process (e.g., by using redistribution layer metal to form the top plate of a capacitor) to effect an entire capacitor structure. This enables flexibility for chip-to-chip applications where, for example, the contactless interconnect between two adjacent integrated circuits may be a series capacitor structure. Other alternatives are available as well, such as inductors to effect inductive coupling between chips.

The timing circuitry 878 provides signal offsets for input to the plurality of transmitter circuits 874a-n. FIG. 24 illustrates one embodiment of the timing circuitry, generally designated 900, for use with the transmitters described above. A plurality of flip-flops 902a-n are disposed at each transmitter input (not shown), and have respective data input lines 904a-n and demand lines 906a-n (collectively forming an N-bit demand path 909) to receive independent data and demand signals. In one embodiment, a multi-phase clock generator or source 908 within interface die 907 outputs N demand signals on demand lines 906a-906n, respectively, with the demand signals being offset in phase by desired phase increments. The phase offset demand signals are then fed to the clock inputs for the flip-flops 902a-902n as shown. Suitable multi-phase clock generators may be realized, for example and without limitation, using simple delay lines, oscillator-fed delay-locked-loop (DLL) circuits, or phase-locked-loop (PLL) circuits, where offset clock signals may be tapped following each delay element in a delay line (for the DLL), or each element in a ring oscillator (for the PLL).

Alternatively, the timing circuitry 908 may comprise a plurality of programmable or variable delay elements (not shown) to offset data signals being input to the transmitter circuitry 872. Static weighted delay elements might also be used to provide the different delays. Additionally, while the timing circuitry described above is implemented upstream of each AC-coupled transmitter input, similar benefits may be realized by employing the timing circuitry between the outputs of the drivers and the series capacitors.

Referring again to FIG. 23, to maximize the bandwidth of the transmission channel, the multiplexer described above may employ termination circuitry 890 in the form of a termination resistor Rterm coupled between the node 876 and a termination voltage terminal Vterm (shown in this embodiment as DC ground). For applications involving relatively short transmission channel lengths, such as "system-in-package" (SiP) environments or other multi-component packages as discussed above, the termination resistor Rterm may be realized by an on-chip resistor implementation. The termination resistor may be realized through many different alternative embodiments, including single or multiple resistor implementations, transistor circuitry to effect a resistive output, and the like.

Due to the loading of multiple capacitive elements in parallel, the signal amplitude on node 876 generated by any one of the individual AC transmitters is reduced compared to how the transmitter would perform in isolation. However, due to the non-zero output impedance of the driver circuit 882, the attenuation effect can be kept to reasonable levels. In an alternative embodiment, the output impedance of the driver circuit 882 may be increased, thereby decreasing the signal attenuation effect, by employing a tri-state driver in each transmitter 874. Such drivers are configured to exhibit a high impedance output when operating in a non-driving mode.

In some applications, electrostatic discharge (ESD) protection circuitry 130 may be disposed in parallel with the termination resistor Rterm. The ESD circuitry may include a pair of reverse-biased diodes D1 and D2 tied between the node 876 and the termination voltage Vterm. Due to the AC-coupled natured of the pulsed signaling multiplexer 870, the ESD circuit complexity may be minimized, which can substantially reduce DRAM die cost by reducing the die size overhead associated with the external interface system on the DRAM die.

In one embodiment, the pulsed signaling multiplexer 870 and its supporting circuitry may be realized by circuitry employed on a single integrated circuit. In other embodiments, one or more support circuits employed by the multiplexer may be implemented on a second integrated circuit.

In operation, data signals are fed along independent data paths to the timing circuitry 878, where they are re-timed (or offset). The re-timing allows the multiplexer transmitters 874a-n to receive at their inputs data signals that are precisely offset in phase with respect to each other. FIG. 25 illustrates an example of the timing relationships between the input data fed from the timing circuitry to the AC-coupled transmitters 874a-n, and the combined output data pulse stream at the common node 876.

As shown in FIG. 25, each transmitter signal output may be offset by an incremental phase. Due to the high-pass filtering nature of the series capacitor, the transmitter output comprises a brief pulse corresponding to the rise and fall times of the input data edge transitions. Since only signal transitions appear at the output of each transmitter, pulses appear on the output node for each signal transition in an "wired-OR" manner. This, in effect, provides a dramatic increase in the signaling rate at the output node 876. In one embodiment, where eight transmitters may be arrayed in parallel with a single output, and offset in phase by ⅛ a symbol period (half the multi-phase clock period), a very low power parallel-to-serial transmitter circuit is achievable.

It should be noted that the various integrated circuits, dice and packages disclosed herein may be described using computer aided design tools and expressed (or represented) as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. "AC-coupled" or "AC-coupling" refers to a capacitive or inductive interconnection between two nodes. An AC-coupled transmitter refers to a signal transmission circuit having a signal driver and an AC coupling between the signal driver and an output node of the AC-coupled transmitter. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A packaged semiconductor device, comprising:
   a package substrate;
   a processor mounted on the package substrate and including host processing logic;
   on-package memory coupled to the package substrate, the on-package memory comprising at least one memory package, each memory package including
      a logic die, and
      multiple memory die stacked with the logic die, the multiple memory die including independently accessible groups of storage cells; and
   wherein multiple memory controllers facilitate independent memory transactions between the at least one memory package and the host processing logic.

2. The packaged semiconductor device according to claim 1, wherein the multiple memory controllers reside on the processor.

3. The packaged semiconductor device according to claim 1, wherein the multiple memory controllers reside in the respective memory packages.

4. The packaged semiconductor device according to claim 1, wherein the logic die and the multiple memory die for each memory package are interconnected by thru-silicon vias.

5. The packaged semiconductor device according to claim 1, wherein the processor is vertically stacked with the at least one memory package.

6. The packaged semiconductor device according to claim 1, wherein each logic die includes first and second memory interface circuits, and each of the multiple memory die include first and second memory arrays that are coupled to the first and second memory interface circuits, respectively.

7. The packaged semiconductor device according to claim 6, wherein access to the first arrays of the multiple memory die are carried out independently from accesses to the second memory arrays of the multiple memory die.

8. The packaged semiconductor device according to claim 1, wherein the memory controllers include serial interface circuitry for coupling to the at least one memory package.

9. An integrated circuit (IC) chip comprising:
host processing logic;
memory interface circuitry for coupling to at least one memory package; and
multiple memory controllers to facilitate independent memory transactions between the host processing logic and the at least one memory package.

10. The integrated circuit (IC) chip according to claim 9, wherein the IC chip further comprises:
a package interface to establish electrical connection with the at least one memory package in a vertically stacked orientation.

11. The integrated circuit (IC) chip according to claim 9 wherein:
each logic die includes first and second memory interface circuits, and each of the multiple memory die include first and second memory arrays that are coupled to the first and second memory interface circuits, respectively.

12. The integrated circuit (IC) chip according to claim 11, wherein:
access to the first arrays of the multiple memory die are carried out independently from accesses to the second memory arrays of the multiple memory die.

13. The integrated circuit (IC) chip according to claim 9, realized as a general purpose processor.

14. The integrated circuit (IC) chip according to claim 9, wherein the memory interface circuitry further comprises:
a serial interface to transfer serialized data between the multiple memory controllers and the at least one memory package.

15. A method of operation in a packaged semiconductor device having a processor with host processing logic and on-package memory mounted to a package substrate, the on-package memory including at least one memory package that each include a logic die and multiple memory die stacked with the logic die, the method comprising:
controlling the at least one memory package with multiple memory controllers by
independently accessing groups of storage cells in the multiple memory die; and
transferring data between the multiple memory die and the multiple memory controllers along data paths that include thru-silicon vias.

16. The method according to claim 15, wherein:
the controlling is carried out by multiple memory controllers formed on the processor.

17. The method according to claim 15, wherein:
the controlling is carried out by multiple memory controllers formed in the respective memory packages.

18. The method according to claim 15, further comprising:
serializing the data for transferring between the multiple memory controllers and the at least one memory package.

* * * * *